(12) United States Patent
Misaki et al.

(10) Patent No.: US 7,253,439 B2
(45) Date of Patent: Aug. 7, 2007

(54) SUBSTRATE FOR DISPLAY, METHOD OF MANUFACTURING THE SAME AND DISPLAY HAVING THE SAME

(75) Inventors: Katsunori Misaki, Kawasaki (JP); Shiro Hirota, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 134 days.

(21) Appl. No.: 11/238,547

(22) Filed: Sep. 29, 2005

(65) Prior Publication Data
US 2006/0022203 A1 Feb. 2, 2006

Related U.S. Application Data

(62) Division of application No. 10/785,652, filed on Feb. 24, 2004, now Pat. No. 6,972,434.

(30) Foreign Application Priority Data
Mar. 10, 2003 (JP) ............................... 2003-063710

(51) Int. Cl.
*H01L 29/04* (2006.01)
*H01L 29/15* (2006.01)
(52) U.S. Cl. ..................... 257/59; 257/72; 257/758; 257/759; 257/775; 257/E51.005; 438/48; 438/128; 438/149; 438/151; 438/157; 438/283
(58) Field of Classification Search .............. 257/72, 257/59, 758, 759, 775, E51.005; 438/48, 438/128, 149, 151, 157, 283
See application file for complete search history.

(56) References Cited
U.S. PATENT DOCUMENTS
6,897,479 B2 5/2005 Fujikawa et al.

6,972,434 B2* 12/2005 Misaki et al. .................. 257/72

FOREIGN PATENT DOCUMENTS

| JP | 3098345 | 7/1994 |
|---|---|---|
| JP | 3372882 | 10/1999 |
| JP | 3267271 | 8/2000 |
| JP | 2001-053283 | 2/2001 |
| JP | 2001-324725 | 11/2001 |

* cited by examiner

*Primary Examiner*—Jerome Jackson
*Assistant Examiner*—Joseph Nguyen
(74) *Attorney, Agent, or Firm*—Greer, Burns & Crain, Ltd.

(57) ABSTRACT

The invention relates to a substrate for a display, a method of manufacturing the same, and a display having the same and provides a substrate for a display which can be manufactured through simple steps with high reliability, a method of manufacturing the same, and a display having the same. The substrate is configured to have a gate bus line, an OC layer formed on the gate bus line, a pixel electrode formed on the OC layer at each pixel region, and a gate terminal for electrically connecting an external circuit and the gate bus line. The gate terminal includes a gate terminal bottom electrode which has an Al type metal layer having a first end face and a high melting point metal layer formed on the Al type metal layer and having a second end face located outwardly from the first end face and which is electrically connected to the gate bus line and a gate terminal top electrode which is formed of the same material as that of the pixel electrode on the gate terminal bottom electrode and which is electrically connected to the gate terminal bottom electrode without contacting the first end face.

3 Claims, 18 Drawing Sheets

(a)

(b)

SUBSTRATE FOR DISPLAY, METHOD OF MANUFACTURING THE SAME AND DISPLAY HAVING THE SAME

This is divisional of Application Ser. No. 10/785,652 filed on Feb. 24, 2004, now U.S. Pat. No. 6,972,434.

BACKGROUND OF THE INVENTION

1. Field of the Invention

The present invention relates to a substrate for a display, a method of manufacturing the same and a display having the same and, more particularly, to a liquid crystal display substrate to be used for an active matrix liquid crystal display utilizing switching elements such as thin film transistors (TFTs) and a method of manufacturing the same.

The invention also relates to a liquid crystal display substrate to be used for a liquid crystal display having a protective insulation layer (insulatiing resin layer) made of an insulating organic resin material provided on an array substrate having switching elements formed thereon and a method of manufacturing the same.

Furthermore, the invention relates to a liquid crystal display substrate to be used for a reflective liquid crystal display whose pixel electrodes are formed of a light-reflecting material and a method of manufacturing the same. The invention also relates to a substrate to be used for a liquid crystal display having a CF-on-TFT structure in which resin color filter (CF) layers are formed on an array substrate and a method of manufacturing the same.

2. Description of the Related Art

For example, an active matrix liquid crystal display (LCD) utilizing TFTs as switching elements is disclosed in Patent Document 4. As schematically described below, Patent Document 4 discloses a configuration of a transmissive LCD having inverted staggered structure TFTs formed with a channel protection film.

A passivation film made of an inorganic insulating material is formed on a substantially entire surface of an array substrate having TFTs formed thereon (hereinafter referred to as "TFT substrate"). Pixel electrodes made of a transparent electrode material is formed on the passivation film. The pixel electrodes are connected to source electrodes of the TFTs through contact holes that are openings in the passivation film.

An external connection terminal connected to a drain bus line (hereinafter simply referred to as "drain terminal") has a bottom electrode formed by an $n^+$ a-Si layer and a metal layer which are the same layers that constitute source and drain electrodes and drain bus lines of the TFTs. A top electrode constituted by a conductive oxide film made of the same material as the pixel electrodes is stacked on the bottom electrode, a contact hole in the passivation film intervening between the electrodes. Connection terminals of a drain bus line driving circuit are connected to the top electrodes to apply a predetermined tone voltage to each drain bus line.

An external connection terminal connected to a gate bus line (hereinafter referred to as "gate terminal") has a bottom electrode formed by a metal layer which is the same layer that constitutes gate electrodes and gate bus lines. A top electrode constituted by a conductive oxide film made of the same material as the pixel electrodes is stacked on the bottom electrode, an insulation film which is the same layer that constitutes a gate insulation film and a contact hole provided in the passivation film intervening between the electrodes. Connection terminals of a gate bus line driving circuit are connected to the top electrodes to apply a predetermined gate pulse to the gate bus lines sequentially. The top electrodes of the gate terminals and the drain terminals prevent oxidation of the bottom electrodes. This makes it possible to improve the reliability of the gate terminals and the drain terminals in the long term and to prevent connection failures at both of the terminals.

A brief description will now be made on a method of manufacturing a transmissive LCD having inverted staggered structure TFTs formed with a channel protection film. A plurality of gate bus lines and gate terminal bottom electrodes are formed on a transparent insulated substrate such as a glass substrate. Next, an insulation film is formed throughout the substrate (the film may be hereinafter referred to as "gate insulation film" depending on the position where the film is formed). Subsequently, an amorphous silicon (a-Si) layer is formed on the insulation film, and channel protection films are then formed. Next, after forming an $n^+$ a-Si layer, a metal layer is formed. The metal layer, the $n^+$ a-Si layer and the a-Si layer are simultaneously etched using the channel protection films as an etching stopper. Thus, active semiconductor layers constituted by a-Si layers are formed on the gate insulation film in TFT regions, and source electrodes and drain electrodes are formed on both sides of the channel protection films to complete the TFTs. At the same time when the source electrodes and the drain electrodes are formed, drain bus lines and drain terminal bottom electrodes connected to the drain bus lines are formed.

A passivation film having a thickness of 400 nm constituted by a silicon nitride film (SiN film) or a silicon oxide film ($SiO_2$ film) which is an inorganic insulating material or a combination of those films is formed throughout the substrate. A resist is then applied, and a photolithographic process is thereafter used to form a resist pattern having an opening above each of the source electrodes, drain terminal bottom electrodes and the gate terminal bottom electrodes. The passivation film or the combination of the passivation film and the insulation film is etched using the resist pattern as a mask to form contact holes in each of them.

Next, a sputtering process is used to form a transparent conductive film having a thickness of 100 nm made of an ITO (indium tin oxide) throughout the substrate. The transparent conductive film is then patterned into a predetermined shape, thereby forming pixel electrodes that are connected to the source electrodes through contact holes. At the same time, drain terminal top electrodes are formed which are connected to the drain terminal bottom electrodes through other contact holes, and gate electrodes top electrodes are formed which are connected to the gate electrode bottom electrodes through other contact holes.

As thus described, according to the disclosure of Patent Document 4, when gate terminals and drain terminals are formed, gate terminal bottom electrodes and drain terminal bottom electrodes are formed; a passivation film covering the gate terminal bottom electrodes and the drain terminal bottom electrodes is formed; the passivation film is etched to provide contact holes; and, at the same time when pixel electrodes are formed, gate terminal top electrodes constituted by transparent conductive films are formed in connection with the gate terminal bottom electrodes through contact holes, and drain terminal top electrodes constituted by transparent conductive films are formed in connection with the drain terminal bottom electrodes through contact holes.

Patent Document 5 discloses a liquid crystal display in which an overcoat layer (hereinafter referred to as "OC layer") made of an insulating organic resin material is formed on an array substrate having switching elements formed thereon. A passivation film as described above is constituted by an organic insulating film such as a SiN film and is formed with a thickness in the range from 300 to 400 nm, in general. On the contrary, an OC layer is characterized in that it is formed with a thickness in the range from 1000 to 3000 nm which is very much greater than that of a passivation film. Further, an OC layer is characterized in that it is formed of a resin having a relatively small dielectric constant (about 3 or less). Because of the two features, a liquid crystal display formed with an OC layer is advantageous in that a parasitic capacity degrading TFT characteristics can be made small. A liquid crystal display formed with an OC layer is also advantageous in that manufacturing steps can be simple because contact holes are formed using the OC layer made of a photosensitive material as an etching mask.

FIGS. 16A and 16B show a configuration of a TFT substrate of a reflective liquid crystal display formed with an OC layer according to the related art. FIG. 16A shows a configuration of the neighborhood of electrode relaying regions of gate terminals of the TFT substrate taken in a direction perpendicular to the substrate surface, and FIG. 16B shows a section taken along the line X-X in FIG. 16A. As shown in FIGS. 16A and 16B, gate terminal bottom electrodes 130 formed of the same material as gate bus lines are formed on a glass substrate 106. In general, a gate terminal bottom electrode 130 has a multi-layer structure which frequently comprises an aluminum (Al) type metal layer 130a having a relatively low resistance formed as a bottom layer and a high melting point metal layer 130b formed as a top layer. An insulation film 132 is formed on the gate terminal bottom electrodes 130. A protective film 134 is formed on the insulation film 132. An OC layer 136 is formed on the protective film 134. For example, the surface of the OC layer 136 is formed with irregularities or wrinkles.

Openings are formed in the OC layer 136, the protective film 134 and the insulation film 132 above the gate terminal bottom electrodes 130 to form electrode relaying regions 138. Gate terminal top electrodes 140 made of the same material as that of pixel electrodes (reflective electrodes) are formed on the OC layer 136. For example, a gate terminal top electrode 140 has a multi-layer structure comprising an ITO layer 140a, a silver (Ag) alloy layer 140b and an ITO layer 140a. The gate terminal top electrodes 140 are connected to the gate terminal bottom electrodes 130 in the electrode relaying regions 138.

FIGS. 17A and 17B show a configuration of a TFT substrate of a transmissive liquid crystal display having a CF-on-TFT structure according to the related art. FIG. 17A shows a configuration of the neighborhood of electrode relaying regions of gate terminals of the TFT substrate taken in a direction perpendicular to the substrate surface, and FIG. 17B shows a section taken along the line Z-Z in FIG. 17A. As shown in FIGS. 17A and 17B, gate terminal bottom electrodes 130 made of the same material as that of gate bus lines are formed on a glass substrate 106. An insulation film 132 is formed on the gate terminal bottom electrodes 130. A protective film 134 is formed on the insulation film 132. Resin CF layers 144 in any of red (R), green (G) and blue (B) are formed on the protective film 134. An OC layer 136 is formed on the resin CF layers 144.

Openings are formed in the OC layer 136, the resin CF layers 144, the protective film 134 and the insulation film 132 above the gate terminal bottom electrodes 130 to form electrode relaying regions 138. Gate terminal top electrodes 140 made of the same material as that of pixel electrodes (e.g., an ITO) are formed on the resin CF layers 144. The gate terminal top electrodes 140 are connected to the gate terminal bottom electrodes 130 in the electrode relaying regions 138.

Incidentally, the documents of the related art are as follows:

Patent Document 1: Japanese Patent Laid-Open No. JP-A-2001-324725

Patent Document 2: Japanese Patent Laid-Open No. JP-A-2001-53283

Patent Document 3: Japanese Patent Laid-Open No. JP-A-11-281993

Patent Document 4: Japanese Patent Laid-Open No. JP-A-6-202153

Patent Document 5: Japanese Patent Laid-Open No. JP-A-2000-231123

However, resin layers such as the OC layer 136 and the resin CF layers 144 are poorer than a passivation film in adhesion to the gate terminal top electrodes 140 that are formed on the resin layers from an electrode material such as an ITO. A problem can therefore arise in that the gate terminal top electrodes 140 formed directly on the OC layer 136 or resin CF layers 144 are flaked to cause conduction failures and shorting between adjoining terminals. Another problem arises in that the patterning of the gate terminal top electrodes 140 is apt to leave residues of the electrode material that can cause shorting between adjoining terminals and to result in etching defects such as a small pattern width which can cause an increase in resistance.

Liquid crystal displays are manufactured through a TFT array fabrication step, a CF fabrication step, a panel fabrication step and a unit fabrication step. At the unit fabrication step, driver ICs are mounted to gate terminals and drain terminals on a TAB (tape automated bonding) basis. A liquid crystal display having a connection defect attributable to misalignment of a driver IC during mounting is repaired by peeling the TAB terminal and reapplying the terminal thereafter. In the above-described configuration, since a top electrode is peeled along with the OC layer 136 or resin CF layer 144 when the TAB terminal is peeled, a problem arises in that it is difficult to repair.

FIGS. 18A, 18B, 19A and 19B show configurations of a TFT substrate in which the above-described problems are solved. FIGS. 18A and 18B show a configuration of a TFT substrate of a reflective liquid crystal display formed with an OC layer. FIG. 18A shows a configuration of the neighborhood of electrode relaying regions of gate terminals of the TFT substrate taken in a direction perpendicular to the substrate surface, and FIG. 18B shows a section taken along the line Y-Y in FIG. 18A. As shown in FIGS. 18A and 18B, an OC layer 136, a protective film 134 and an insulation film 132 between the adjoining gate terminals have end faces that are substantially aligned with an end face of gate terminal bottom electrodes 130 located on the side of electrode relaying regions 138. Protrusions 142 are formed on the end faces of the OC layer 136, the protective film 134 and the insulation film 132 substantially in the middle of the intervals between the adjoining gate terminals such that they protrude toward an end of the substrate (leftward in FIG. 18A), the protrusions being formed like triangles whose sections in parallel with the substrate surface have an acute apical angle. The protrusions 142 are provided to prevent the adjoining gate terminals from being shorted by etching residues that are left when gate terminal top electrodes 140 are patterned.

FIGS. 19A and 19B show a configuration of a TFT substrate of a transmissive liquid crystal display having a CF-on-TFT structure. FIG. 19A shows a configuration of the neighborhood of electrode relaying regions of the TFT substrate taken in a direction perpendicular to the substrate surface, and FIG. 19B shows a section taken along the line W-W in FIG. 19A. As shown in FIGS. 19A and 19B, an OC layer 136, a resin CF layer 144, a protective film 134 and an insulation film 132 between the adjoining gate terminals have end faces that are shifted toward a display area (rightward in FIGS. 19A and 19B) from end faces of gate terminal top electrodes 140 located in electrode relaying regions 138. That is, the surface of the glass substrate 106 is exposed in regions between the adjoining gate terminals on the substrate-end side (left-hand side in FIGS. 19A and 19B) of the end faces of the OC layer 136, the resin CF layer 144, the protective film 134 and the insulation film 132. Protrusions 142 are formed on the end faces of the OC layer 136, the protective film 134 and the insulation film 132 substantially in the middle of the intervals between the adjoining gate terminals such that they protrude toward the end of the substrate, the protrusions being formed like triangles whose sections in parallel with the substrate surface have an acute apical angle. The protrusions 142 are provided to prevent the adjoining gate terminals from being shorted by etching residues that are left when gate terminal top electrodes 140 are patterned.

On the TFT substrates shown in FIGS. 18A to 19B, the OC layer 136 is removed to form the gate terminal top electrodes 140 in direct contact with the glass substrate 106, thereby preventing flaking of the gate terminal top electrodes 140. In the above-described configurations, however, since the end faces of the gate terminal bottom electrodes 130 located at the electrode relaying regions 138 are shaped steeply relative to the substrate surface, the gate terminal top electrodes 140 may be broken at steps formed on the end faces, which results in the problem of an increase in the resistance of the gate terminals. Further, corrosion is likely to occur at the end faces of the gate terminal bottom electrodes 130 located at the electrode relaying regions 138 because the underlying Al type metal layers 130a and the gate terminal top electrodes 140 made of an ITO are in contact with each other, which results in a problem in that line breakage can occur. Thus, sufficient consideration must be paid for breakage of the gate terminal top electrodes 140 and electrical connection between the gate terminal top electrodes 140 and the gate terminal bottom electrodes 130 in the electrode relaying regions 138.

SUMMARY OF THE INVENTION

It is an object of the invention to provide a substrate for a display, a method of manufacturing the same and a display having the same which allow manufacturing steps to be simplified and which provide high reliability.

The above-described object is achieved by a substrate for a display, characterized in that it comprises: a plurality of bus lines formed on a base substrate such that they intersect with each other with an insulation film interposed therebetween; an insulation resin layer formed on the bus lines; a pixel electrode formed on the insulation resin layer in each of pixel regions arranged on the base substrate; and an external connection terminal for electrically connecting an external circuit and the bus lines, the external connection terminal including a first terminal electrode which has a first layer formed of Al or Al alloy and having a first end face and a second layer formed of a high melting point metal on the first layer and having a second end face located outwardly from the first end face, the first terminal electrode being electrically connected to the bus lines, and a second terminal electrode which is formed of the same material as that of the pixel electrode on the first terminal electrode and which is electrically connected to the first terminal electrode without contacting the first end face.

DESCRIPTION OF THE PREFERRED EMBODIMENTS

First Embodiment

Figure 1:
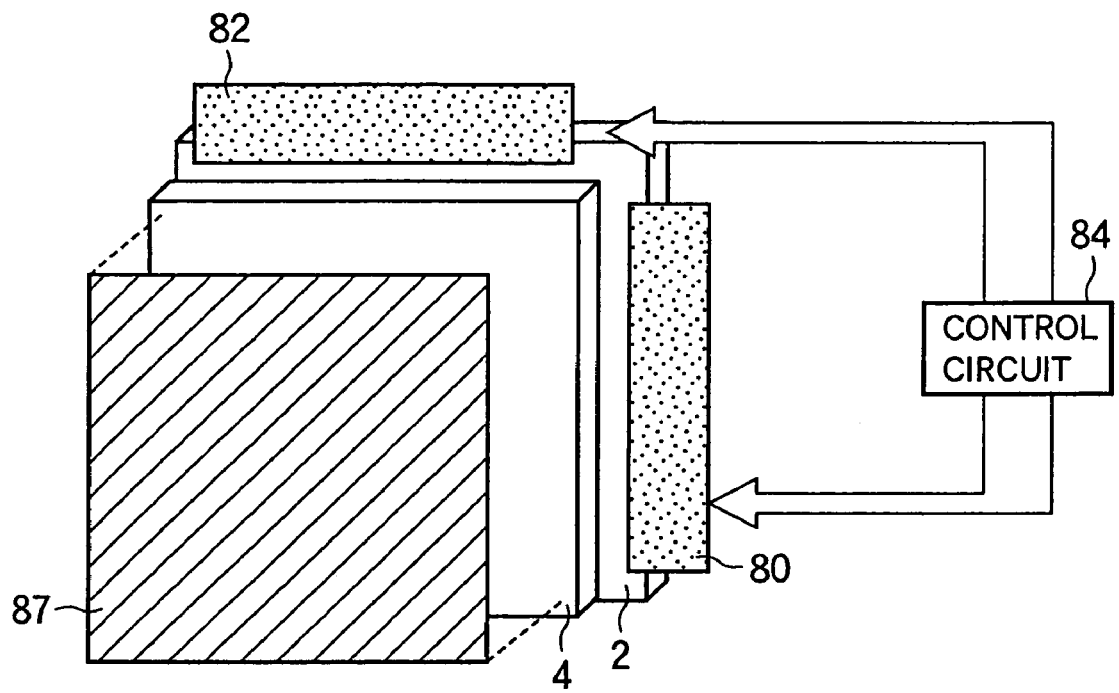
FIG. 1 shows a schematic configuration of a display according to a first embodiment of the invention.

A description will now be made with reference to FIGS. 1 to 7D on a substrate for a display, a method of manufacturing the same, and a display having the same according to a first embodiment of the invention. FIG. 1 shows a schematic configuration of a reflective liquid crystal display of the present embodiment. As shown in FIG. 1, the reflective liquid crystal display has a structure in which a TFT substrate (base substrate) 2 having a pixel electrode made of a light-reflecting material and a TFT formed in each pixel region and an opposite substrate 4 having a common electrode formed thereon are combined in a face-to-face relationship to seal a liquid crystal between them.

A gate bus line driving circuit 80 loaded with a driver IC for driving a plurality of gate bus lines 12 and a drain bus line driving circuit 82 loaded with a driver IC for driving a plurality of drain bus lines 14 are provided on the TFT substrate 2. The driving circuits 80 and 82 output scan signals and data signals to predetermined gate bus lines 12 and drain bus lines 14 based on predetermined signals output by a control circuit 84.

The opposite substrate 4 has a resin CF layer in any of the colors R, G and B at each pixel region. Alignment films for aligning liquid crystal molecules in a predetermined direction are formed on surfaces of the substrate 2 and 4 opposite to each other. A polarizer 87 is applied to the surface of the opposite substrate 4 opposite to the surface facing the TFT substrate.

Figure 2:
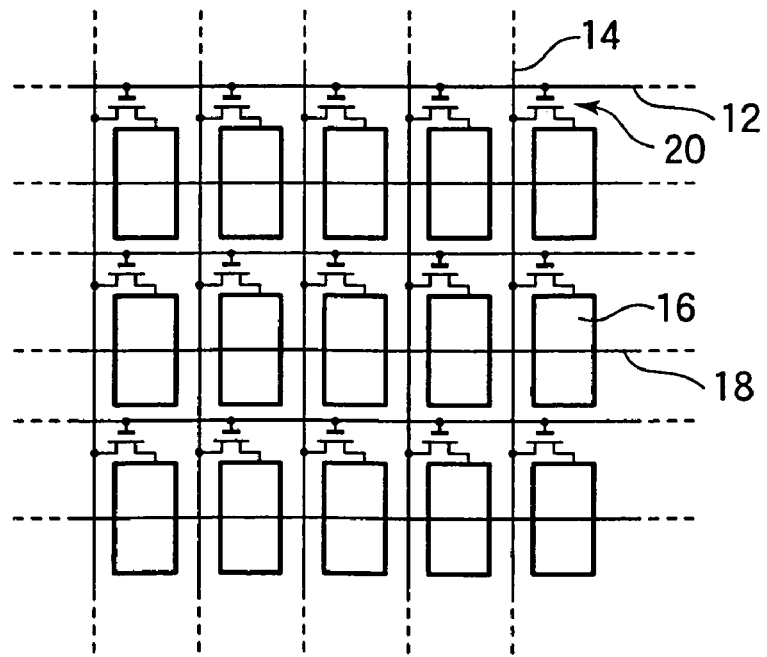
FIG. 2 schematically shows an equivalent circuit of a substrate for a display according to the first embodiment of the invention.
Figure 3:
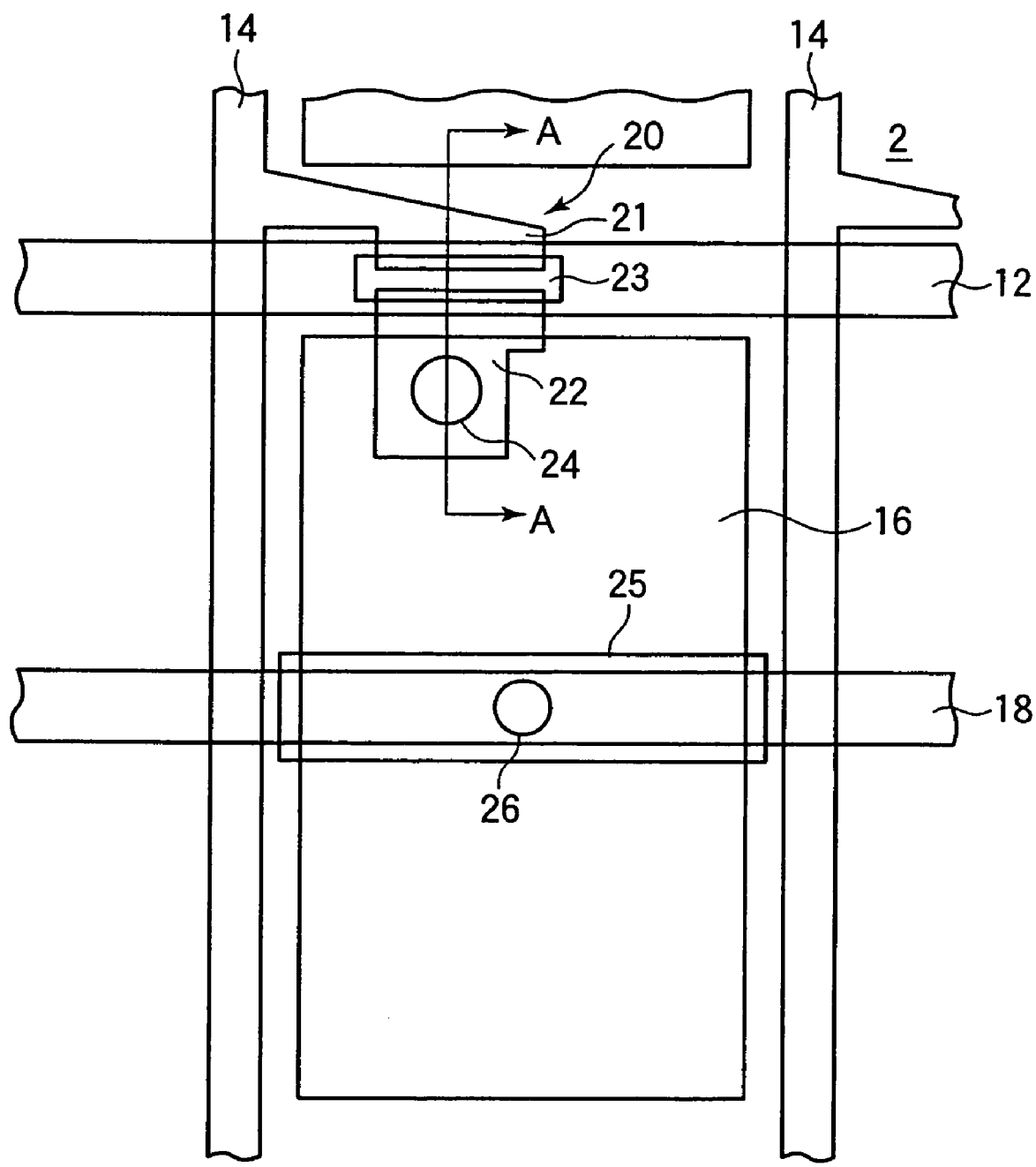
FIG. 3 shows a configuration of one pixel of the substrate for a display according to the first embodiment of the invention.
Figure 4:
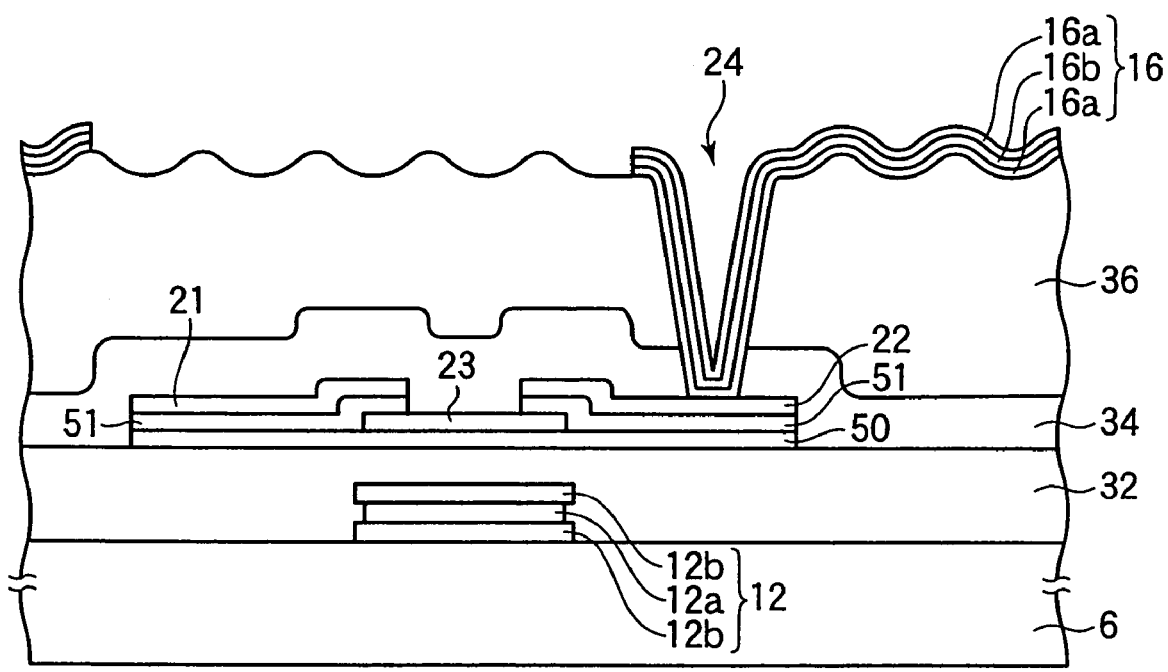
FIG. 4 is a sectional view showing a configuration of the substrate for a display taken along the line A-A in FIG. 3.

FIG. 2 schematically shows an equivalent circuit of elements formed on the TFT substrate 2. FIG. 3 shows a configuration of one pixel of the TFT substrate 2, and FIG. 4 shows a section of the TFT substrate 2 taken along the line A-A in FIG. 3. As shown in FIGS. 2 to 4, a plurality of gate bus lines 12 extending in the horizontal direction in FIG. 2 or 3 are formed in parallel with each other on a glass substrate 6 that constitutes the TFT substrate 2. For example, a gate bus line 12 has a structure in which a high melting point metal layer 12b, an Al type metal layer 12a having a relatively low resistance and another high melting point metal layer 12b are stacked in the order listed. The Al type metal may be aluminum or an aluminum alloy. An end face of the Al type metal layer 12a is formed inwardly from end faces of the high melting point metal layers 12b.

An insulation film (gate insulation film) 32 is formed throughout the surface over the gate bus lines 12. A plurality of drain bus lines 14 extending in the vertical direction in FIGS. 2 and 3 are formed in parallel with each other such that they intersect with the gate bus lines 12 with the insulation film 32 interposed between them. TFTs 20 are formed in the vicinity of positions where the gate bus lines 12 and the drain bus lines 14 intersect with each other.

A TFT 20 has an active semiconductor layer 50 constituted by an a-Si layer on the insulation film 32. A channel protection film 23 is formed on the active semiconductor layer 50. A drain electrode 21 extended from an adjacent drain bus line 14 and an n+ a-Si layer 51 to serve as an ohmic contact layer underlying the same are formed on the channel protection film 23 such that they face a source electrode 22 and another n+ a-Si layer 51 underlying the same with a predetermined gap kept between them. In such a configuration, the gate bus line 12 directly under the channel protection film 23 serves as a gate electrode of the TFT 20.

A storage capacitor bus line 18 extending in the horizontal direction in FIGS. 2 and 3 in parallel with the gate bus lines 12 is formed such that it traverses each of the pixel regions arranged in the form of a matrix on the TFT substrate 2 substantially in the middle of the region. The storage capacitor bus lines 18 are formed of the same material as that of the gate bus lines 12. A storage capacitor electrode (intermediate electrode) 25 is formed on the storage capacitor bus line 18 in each pixel region with the insulation film 32 interposed between them. The storage capacitor electrodes 25 are formed of the same material as that of the drain bus lines 14. A protective film 34 is formed on the drain bus lines 14, the drain electrodes 21, the source electrodes 22 and the storage capacitor electrodes 25. An OC layer 36 that is an insulating resin layer is formed on the protective film 34. For example, the surface of the OC layer 36 is formed with irregularities or wrinkles.

A pixel electrode (reflective electrode) 16 is formed on the OC layer 36 in each pixel region. The pixel electrodes 16 are formed of a light-reflecting material, and they have a multi-layer structure constituted by an ITO layer 16a, an Ag alloy layer 16b and another ITO layer 16a, for example. The surface of the pixel electrodes 16 is formed with irregularities or wrinkles in compliance with the configuration of the surface of the OC layer 36. Light entering from the display screen side is subjected to scattered reflection at the irregular or wrinkly surface of the pixel electrodes 16 to achieve high display characteristics. A pixel electrode 16 is electrically connected to the source electrode 22 through a contact hole 24 that is an opening in the OC layer 36 and the protective film 34 above the source electrode 22. The pixel electrode 16 is also electrically connected to the storage capacitor electrode 25 through a contact hole 26 that is an opening in the OC layer 36 and the protective film 34 above the storage capacitor electrode 25. The TFTs 20 and the bus lines 12, 14 and 18 are formed at a photolithographic step and are formed by repeating a series of semiconductor processes including film formation that is followed by resist application, exposure, development, etching and then resist removal.

Figure 5A:
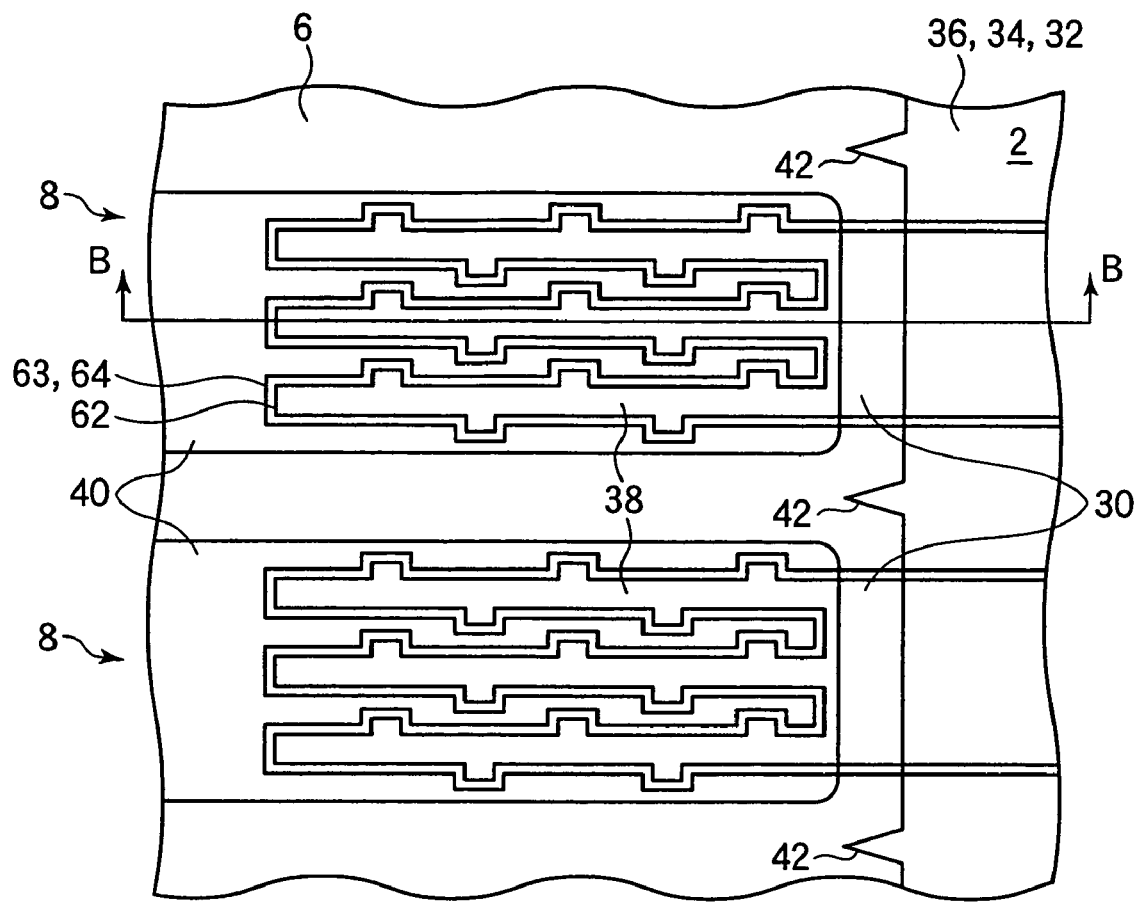
FIGS. 5A and 5B show a configuration of the neighborhood of electrode relaying regions of gate terminals of a substrate for a display according to the first embodiment of the invention.
Figure 5B:
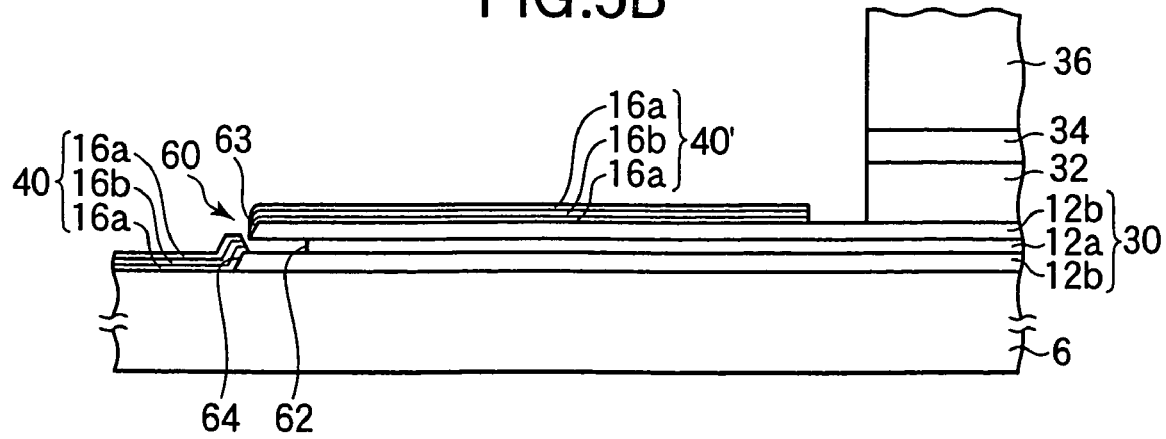

FIG. 5A shows a configuration of the neighborhood of electrode relaying regions of gate terminals of a substrate for a display according to the present embodiment taken in a direction perpendicular to the substrate surface, and FIG. 5B shows a section taken along the line B-B in FIG. 5A. As shown in FIGS. 5A and 5B, a plurality of gate terminals 8 (two of which are shown in FIG. 5A) are formed in a picture-frame area of a TFT substrate 2. The plurality of gate terminals 8 are electrically connected to a plurality of respective gate bus lines 12 formed in a display area (located on the right-hand side of the terminals in FIGS. 5A and 5B, although not shown). A gate terminal 8 has a gate terminal bottom electrode 30 (first terminal electrode), a gate terminal top electrode 40 (second terminal electrode) and an electrode relaying region 38 where the electrodes 30 and 40 are connected.

The gate terminal bottom electrode 30 is formed of the same material as that of the gate bus lines 12. That is, the gate terminal bottom electrode 30 has a structure in which a high melting point metal layer (third layer) 12b, an Al type metal layer (first layer) 12a and another high melting point metal layer (second layer) 12b are stacked in the order listed. The gate terminal bottom electrode 30 in the electrode relaying region 38 is patterned, for example, in a planar configuration having a plurality of recesses and protrusions such that it will have a great circumference. An end face 62 of the Al type metal layer 12a of the gate terminal bottom electrode 30 is formed inwardly from an end face 63 of the upper high melting point metal layer 12b and an end face 64 of the lower high melting point metal layer 12b.

An insulation film 32 that is the same as the insulation layer 32 shown in FIG. 4 is formed on the gate terminal bottom electrodes 30. A protective film 34 and an OC layer 36 that are the same as the protective film 34 and the OC layer 36 shown in FIG. 4, respectively, are formed on the insulation film 32 in the order listed. The OC layer 36, the protective film 34 and the insulation film 32 have been removed in the vicinity of an electrode relaying region 38 during patterning to form a contact hole 24 above a source electrode 22 of a TFT 20. The OC layer 36, the protective film 34 and the insulation film 32 have end faces which shifted toward a display area from the electrode relaying region 38. Protrusions 42 are formed on the end faces of the OC layer 36, the protective film 34, and the insulation film 32 substantially in the middle of the intervals between the adjoining gate terminals 8 such that they protrude toward an end of the substrate, the protrusions being formed like triangles whose sections in parallel with the substrate surface have an acute apical angle. The protrusions 42 are provided to prevent the adjoining gate terminals 8 from being shorted by etching residues that are left when gate terminal top electrodes 40 described below are patterned.

Gate terminal top electrodes 40 are formed so as to cover the gate terminal bottom electrodes 30 in the relaying regions 38. The gate terminal top electrodes 40 are formed of the same material as that of pixel electrodes 16. The gate terminal top electrode 40 shown in FIG. 5B is broken at a step in the vicinity of an end of the gate terminal bottom electrode 30. Therefore, there are gate terminal top electrodes 40 and 40' that are separated from each other at a broken part 60 at the step. An ITO layer 16a of the gate terminal top electrode 40 is in contact with the end face 64 of the lower high melting point metal layer 12b of the gate terminal bottom electrode 30. An ITO layer 16a of the gate terminal top electrode 40' is in contact with the end face 63 and a top surface of the upper high melting point metal layer 12b of the gate terminal bottom electrode 30. Therefore, the gate terminal top electrodes 40 and 40' are electrically connected to each other through the gate terminal bottom electrode 30. The Al type metal layer 12a of the gate terminal bottom electrode 30 is not in contact with the ITO layers 16a of the gate terminal top electrodes 40 and 40' because its end face 62 is formed inwardly from the end faces 63 and 64 of the high melting point metal layers 12b.

The lower high melting point metal layer 12b of the gate terminal bottom electrode 30 is patterned such that it has a great circumference. Thus, although the gate terminal top electrode 40 and the gate terminal bottom electrode 30 are in contact with each other only at the end face 64 of the lower high melting point metal layer 12b of the gate terminal bottom electrode 30, a great contact area is maintained. Therefore, no connection failure occurs between the electrodes 30 and 40, and there will be no increase in contact resistance.

Al though not shown, drain terminals have the same structure as that of the gate terminals 8. Specifically, drain terminal bottom electrodes are formed by the same layer that constitutes the gate terminal bottom electrodes 30, and drain terminal top electrodes are formed by the same layer that constitutes the gate terminal top electrodes 40. For example, drain bus lines 14 and the drain terminal bottom electrodes are respectively electrically connected through separate relaying regions that are formed by providing openings in the insulation film 32. The drain terminal bottom electrodes may be formed of the same materials as those of the drain bus lines 14 (e.g., a high melting point metal layer, an Al type metal layer and another high melting point metal layer stacked on one another).

In the present embodiment, the ITO layers 16a of the gate terminal top electrodes 40 are not in direct contact with the Al type metal layers 12a of the gate terminal bottom electrodes 30. It is therefore possible to prevent corrosion of the terminal sections and to prevent line breakage attributable to corrosion.

In the present embodiment, the gate terminal top electrodes 40 are formed on the glass substrate 6 with a high degree of adhesion instead of being formed on the OC layer 36. It is therefore possible to prevent the gate terminal top electrodes 40 and the OC layer 36 from being flaked when TAB terminals are peeled without using a special resin for the OC layer 36.

Figure 6A:
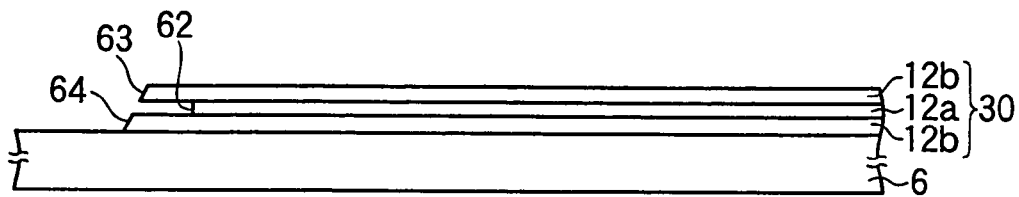
FIGS. 6A to 6E are sectional views taken in processes showing a method of manufacturing a substrate for a display according to the first embodiment of the invention.

A method of manufacturing a substrate for a display according to the present embodiment will now be described with reference to FIGS. 6A to 7D. FIGS. 6A to 7D are sectional views taken in processes showing steps for manufacturing a TFT substrate, and they show a section corresponding to that shown in FIG. 5B. First, as shown in FIG. 6A, a titanium (Ti) layer or Ti alloy layer having a thickness of, for example, 30 nm, an Al layer or Al alloy layer having a thickness of, for example, 130 nm, another Ti layer or Ti alloy layer having a thickness of, for example, 70 nm, and still another Ti layer or Ti alloy layer having a thickness of, for example, 15 nm are formed in the order listed on an entire surface of a glass substrate 6 which is a transparent insulated substrate using sputtering, those layers being formed directly on the substrate or after forming a protective film of $SiO_x$ on the substrate as occasion demands. Thus, a metal layer having a thickness of about 245 nm constituted by a high melting point metal layer 12b, an Al type metal layer 12a, and another high melting point metal layer 12b is formed. As the high melting point metal, for example, chromium (Cr), molybdenum (Mo), tantalum (Ta), Tungsten (W) and alloys of those metals may be used instead of Ti. A material obtained by adding one or plurality of elements among neodymium (Nd), silicon (Si), copper (Cu), Ti, W, Ta and scandium (Sc) to Al may be used as the Al alloy.

Next, a resist is applied throughout the top surface of the metal layers. The resist is then exposed and developed using a photo-mask or reticle (hereinafter simply referred to as "mask") to form a resist pattern having a predetermined shape. Next, dry etching is performed using a chlorine type gas. As a result, gate terminal bottom electrodes 30 are formed, and gate bus lines 12 and storage capacitor bus lines 18 (both of which are not shown in FIG. 6A) are formed. Further, wet etching is performed using a phosphoric acid type etchant to etch sides of the Al type metal layers 12a. Thus, end faces 62 of the Al type metal layers 12a are formed inwardly from end faces 63 and 64 of the high melting point metal layers 12b. Depending on the conditions for the dry etching, the sides of the Al type metal layers 12a can be etched without performing wet etching.

Figure 6B:
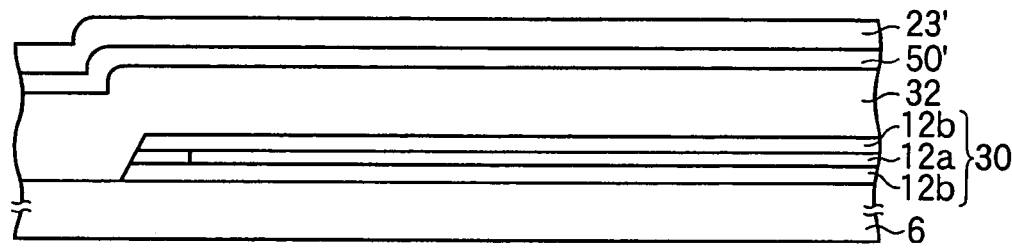

Next, as shown in FIG. 6B, a SiN film having a thickness of, for example, 400 nm is formed throughout the substrate using a plasma CVD process to provide an insulation film 32. Then, an a-Si layer 50' having a thickness of, for example, 30 nm for forming active semiconductor layers 50 is formed throughout the substrate using a plasma CVD process. Further, a SiN film 23' having a thickness of, for example, 120 nm for forming channel protection films 23 is formed throughout the substrate using a plasma CVD process.

Spin coating or the like is then performed to apply a resist to the entire top surface of the SiN film 23'. Next, back exposure is performed from the back side of the glass substrate 6 (from the underside of the same in FIG. 6B) using a mask for shielding a picture-frame area in which gate terminals and drain terminals are formed from light and using the gate bus lines 12 as a mask. Subsequently, exposure is performed from the top side of the glass substrate 6 (from above the same in FIG. 6B) using another mask. Development is thereafter performed to dissolve and remove the resist in exposed regions. Thus, resist patterns (not shown) are formed on a self-alignment basis on regions of the gate bus lines 12 where channel protection films 23 are to be formed.

Figure 6C:
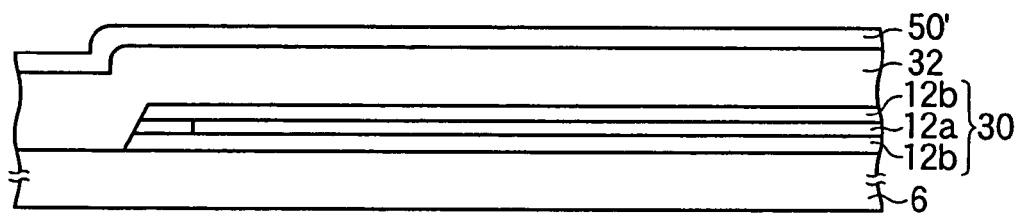

Next, dry etching is performed using a fluorine type gas and using the resist patterns obtained as described above as an etching mask. Thus, as shown in FIG. 6C, the SiN film 23' is etched and removed in the vicinity of regions to become relaying regions 38 throughout the surface, and a channel protection film 23 (not shown in FIG. 6C) is formed at each TFT 20.

Figure 6D:
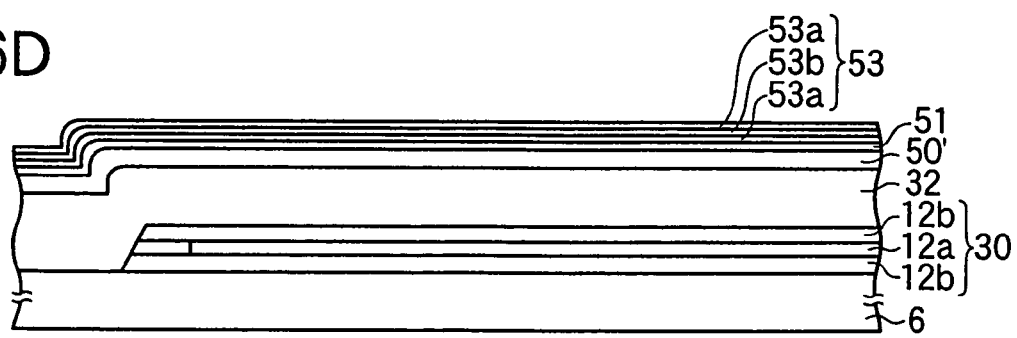

Next, as shown in FIG. 6D, the surface of the a-Si layer 50' is cleaned (natural oxide films are removed) using dilute hydrofluoric acid, and an n$^+$ a-Si layer 51 having a thickness of, for example, 30 nm is thereafter quickly formed throughout the surface using a plasma CVD process. Next, for example, a metal layer 53 is formed to provide drain electrodes 21, source electrodes 22, storage capacitor electrodes 25 and drain bus lines 14, the metal layer 53 being a stack of a Ti layer (or Ti alloy layer) 53a, an Al layer (or Al alloy layer) 53b and another Ti layer (or Ti alloy layer) 53a which are formed using a sputtering process to thicknesses of 20, 75 and 40 nm, respectively. For example, high melting point metal layers made of Cr, Mo, Ta, W or an alloy of any of those elements may be used instead of the Ti layers 53a.

Figure 6E:
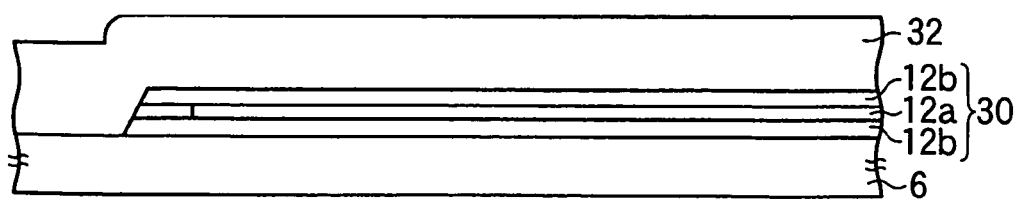

A resist is then applied to the entire top surface of the metal layer 53. Next, exposure and development is performed using a mask to form a resist pattern having a predetermined shape. Dry etching is performed on the metal layer 53, the n$^+$ a-Si layer 51 and the a-Si layer 50' with a chlorine type gas using the resist pattern as an etching mask. As a result, as shown in FIG. 6E, the metal layer 53, the n$^+$ a-Si layer 51 and the a-Si layer 50' in the vicinity of the regions to become relaying regions 38 are etched and removed throughout the substrate to form the drain bus lines 14, the drain electrodes 21, the source electrodes 22, the storage capacitor electrodes 25 and the active semiconductor layers 50 (none of which is shown in FIG. 6E). During this etching process, the channel protection films 23 function as an etching stopper to leave the a-Si layer 50' under the same unetched.

Figure 7A:
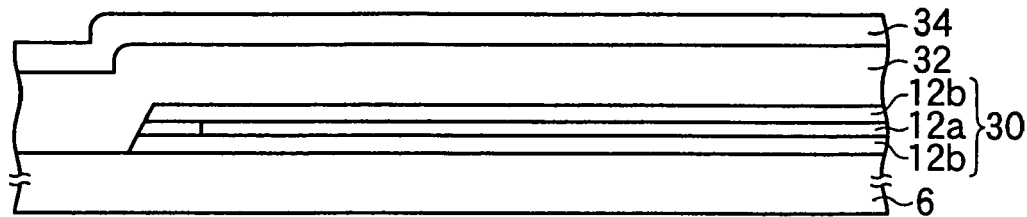
FIGS. 7A to 7D are sectional view taken in processes showing the method of manufacturing a substrate for a display according to the first embodiment of the invention.

Next, as shown in FIG. 7A, a SiN film having a thickness of, for example, 300 nm is formed throughout the substrate using a plasma CVD process to provide a protective film 34.

Figure 7B:
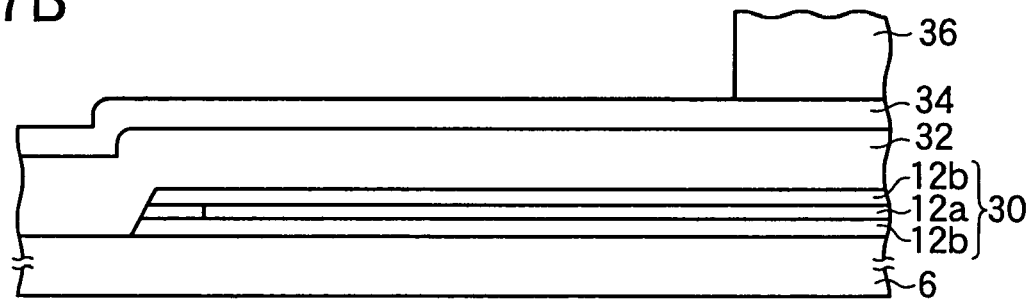

Next, as shown in FIG. 7B, an insulating organic resin having photosensitivity is applied to the entire top surface of the protective film 34 to provide an OC layer 36. Next, the surface of the OC layer 36 is formed with irregularities or wrinkles using a half exposure or two exposures, and the OC layer 36 is then patterned. The OC layer 36 is removed in the vicinity of the electrode relaying regions 38 and in regions on a substrate-end side of the electrode relaying regions 38 to expose a surface of the protective film 34. The OC layer 36 has openings above regions where contact holes 24 and 26 are to be formed.

Figure 7C:
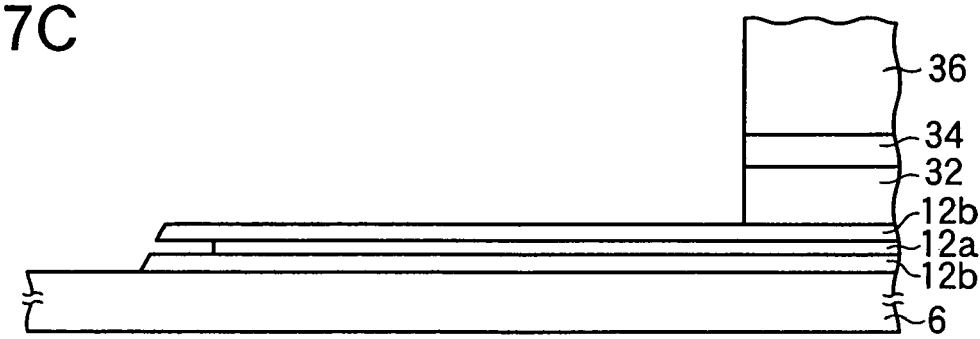

Subsequently, as shown in FIG. 7C, dry etching is performed with a fluorine type gas to etch and remove the protective film 34 and the insulation film 32 using the patterned OC layer 36 as an etching mask. As a result of this etching, the protective film 34 and the insulation film 32 are removed in regions where gate terminal top electrodes 40 are to be formed, and surfaces of the high melting point metal layers 12b of the gate terminal bottom electrodes 30 and a surface of the glass substrate 6 are exposed. At the same time, openings are formed in the protective film 34 and the insulation film 32 above the source electrodes 22 of the TFTs 20 to form the contact holes 24. Similarly, openings are formed in the protective film 34 and the insulation film 32 above the storage capacitor electrodes 25 to form the contact holes 26.

While side etching of the Al type metal layers 12a is performed immediately after forming the gate terminal bottom electrodes 30 in the present embodiment (see FIG. 6A), the side etching of the Al type metal layers 12a may be performed after the OC layer 36, the protective film 34 and the insulation film 32 are patterned to expose the gate terminal bottom electrodes 30. When the side etching of the Al type metal layers 12a is performed immediately after forming the gate terminal bottom electrodes 30, the Al type metal layers 12a of the gate bus lines 12 in the display area are also etched. When the end faces of the Al type metal layers 12a are formed inwardly from the end faces of the high melting point metal layers 12b, the end faces of the gate bus lines 12 as a whole have a concave configuration (see FIG. 4). This reduces the coating effect of the insulation film 32, and insulation between the gate electrodes (gate bus lines) 12 of the TFTs 20 and the drain electrodes 21 and the source electrodes 22 may be consequently degraded. This problem will not occur when the side etching of the Al type metal layers 12a is performed after the OC layer 36, the protective film 34 and the insulation film 32 are patterned to expose the gate terminal bottom electrodes 30 because the Al type metal layers 12a of the gate bus lines 12 in the display area will not be etched.

Although the protective film 34 is patterned using the patterned OC layer 36 as an etching mask in the present embodiment, the OC layer 36 may be formed after patterning the protective film 34.

Figure 7D:
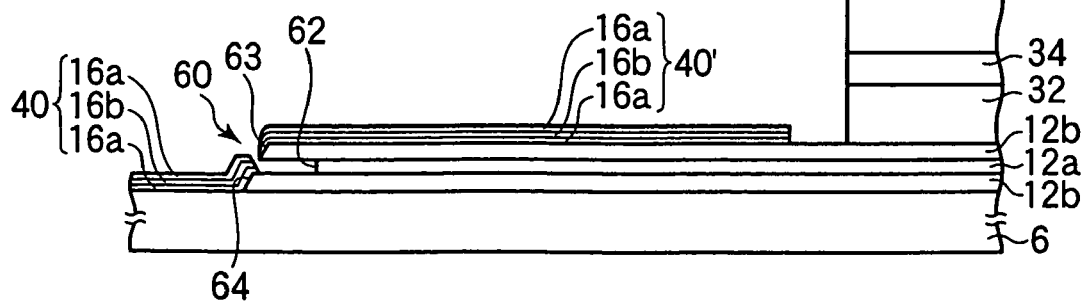

Subsequently, as shown in FIG. 7D, an ITO layer 16a having a thickness of, for example, 50 nm that is a transparent oxide conductive material, an Ag alloy layer 16b having a thickness of, for example, 100 nm and another ITO layer 16a having a thickness of, for example, 50 nm are formed in the order listed throughout the substrate using a thin film forming method such as sputtering. Next, a resist pattern having a predetermined shape is formed, and wet etching is performed using an oxalic acid type etchant and using the resist pattern as an etching mask. Thus, gate terminal top electrodes 40 which are electrically connected to the gate terminal bottom electrodes 30 are formed in the electrode relaying regions 38. At the same time, a pixel electrode 16 is formed in a display area at each pixel region, the pixel electrode being electrically connected to the source electrode 22 through the contact hole 24 and being electrically connected to the storage capacitor electrode 25 through the contact hole 26. The Al type metal layers 12a of the gate terminal bottom electrodes 30 are not in contact with the ITO layers 16a of gate terminal top electrodes 40 and 40' because their end faces 62 are formed inwardly from end faces 63 and 64 of the respective high melting point metal layers 12b. Thus, corrosion of the terminal sections and line breakage attributable to corrosion can be prevented to improve the reliability of the terminal sections. Thereafter, a thermal process is performed at a temperature in the range from 150 to 230° C. or preferably at a temperature of 200° C.

As described above, the present embodiment makes it possible to provide a highly reliable liquid crystal display without making manufacturing steps complicated.

Second Embodiment

Figure 8:
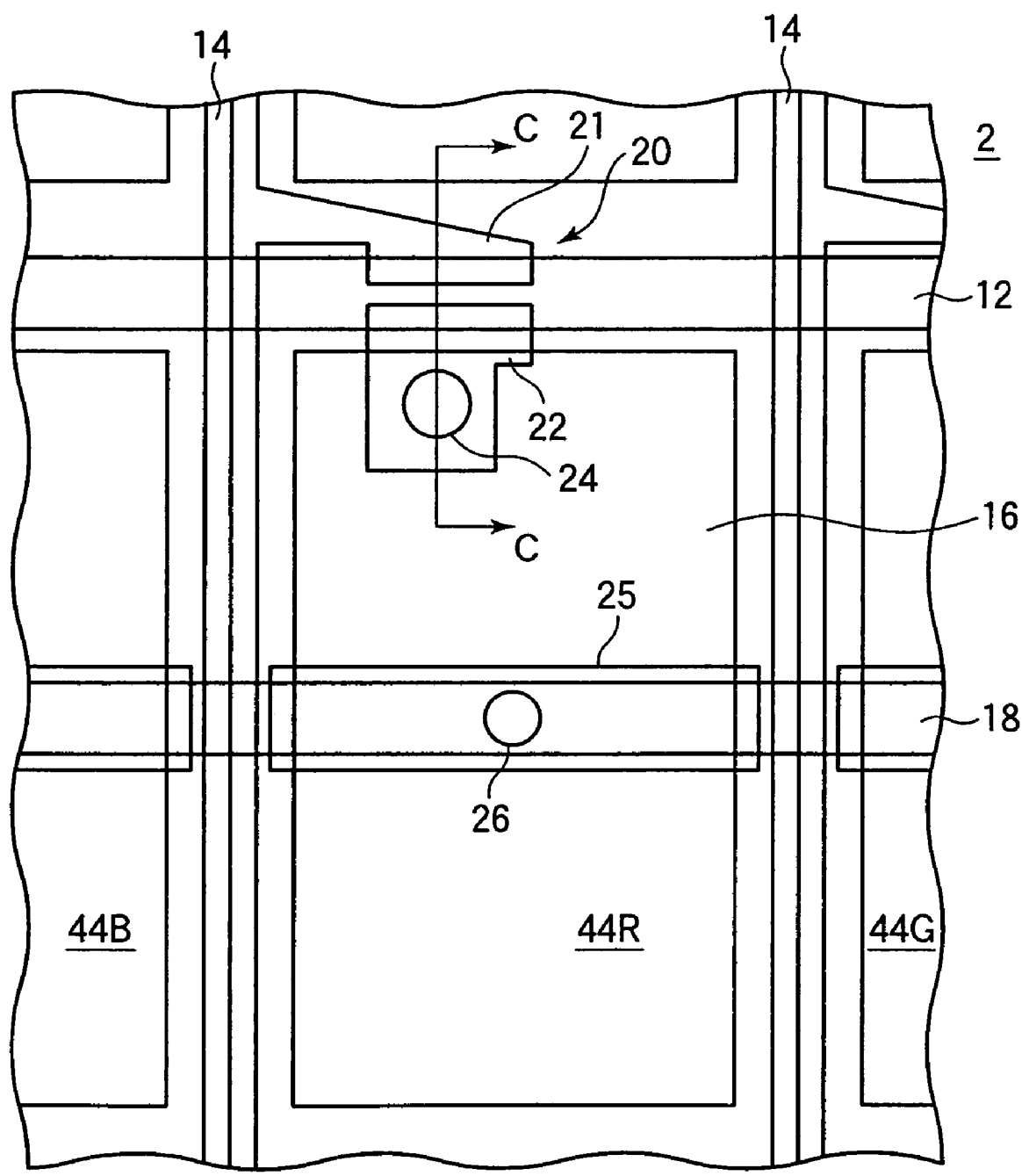
FIG. 8 shows a configuration of one pixel of a substrate for a display according to a second embodiment of the invention.
Figure 9:
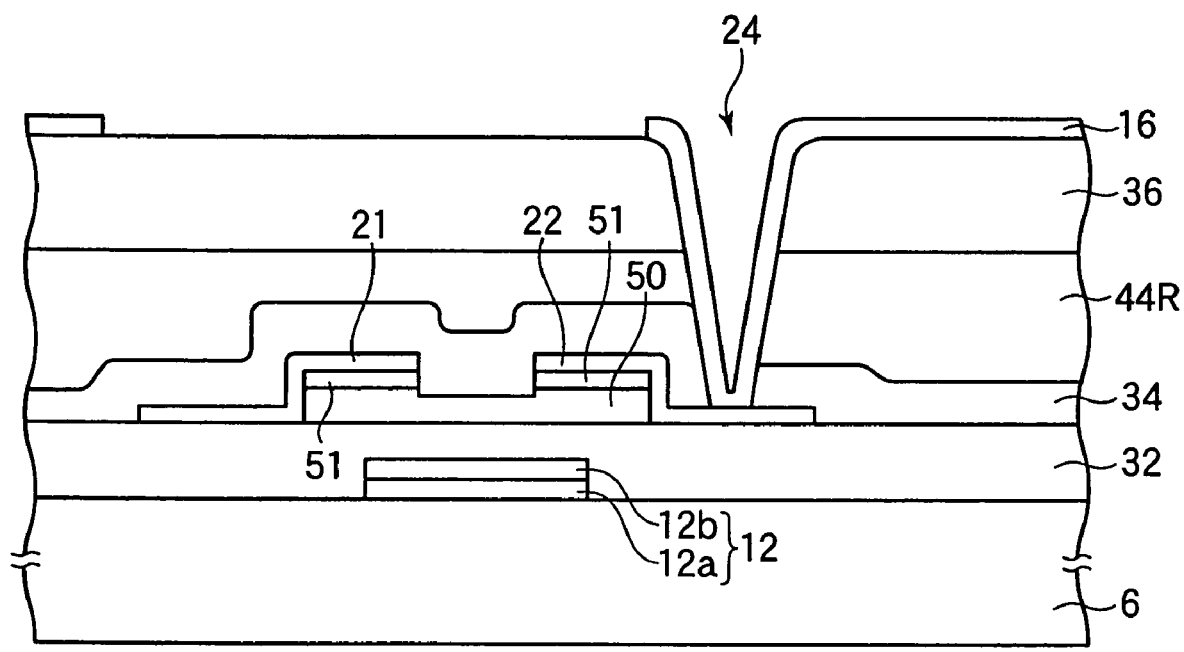
FIG. 9 is a sectional view showing a configuration of the substrate for a display taken along the line C-C in FIG. 8.

A description will now be made with reference to FIGS. 8 to 12D on a substrate for a display and a method of manufacturing the same according to a second embodiment of the invention. FIG. 8 shows a configuration of one pixel of a TFT substrate (base substrate) 2 used in a transmissive liquid crystal display of the present embodiment. FIG. 9 shows a section of the TFT substrate 2 taken along the line C-C in FIG. 8. As shown in FIGS. 8 and 9, a TFT 20 of the TFT substrate 2 of the present embodiment is a channel etched type which has no channel protection film. The TFT substrate 2 of the present embodiment has a CF-on-TFT structure in which pigment dispersion type resin CF layers 44 are formed and in which an OC layer 36 made of an insulating organic resin material is formed on the resin CF layers 44.

A TFT 20 has an active semiconductor layer 50 on an insulation film 32. On the active semiconductor layer 50, a drain electrode 21 and an n⁺ a-Si layer 51 under the same and a source electrode 22 and an n⁺ a-Si layer 51 under the same are formed in a face-to-face relationship with each other with a predetermined gap left between them. The surface of a channel region of the active semiconductor layer 50 is partially etched to ensure separation and insulation between the electrodes 21 and 22.

Any of resin CF layers 44R (red), 44G (green) and 44B (blue) is formed in each pixel region that includes a TFT 20 and a storage capacitor electrode 25. In the CF-on-TFT structure, since the TFTs 20 can be shielded from light by the resin CF layers 44R, 44G and 44B, high display characteristics can be achieved even with a configuration having no particular shielding pattern. Further, there is no need for forming a shielding film on an opposite substrate 4, which not only allows manufacturing steps for the opposite substrate 4 to be simplified but also eliminates a need for high accuracy in combining the TFT substrate 2 and the opposite substrate 4. Therefore, liquid crystal displays having a high aperture ratio and high definition can be manufactured on a mass production basis without forming bus lines 12 and 14 in strict alignment with ends of pixel electrodes 16.

An OC layer 36 is formed on the resin CF layers 44R, 44G and 44B. A pixel electrode 16 made of a transparent oxide electrode material such as ITO is formed on the OC layer 36 at each pixel. The pixel electrodes 16 are electrically connected to source electrodes 22 through contact holes 24 which are openings in the OC layer 36, the resin CF layers 44R, 44G, 44B and a protective film 34 located above the source electrodes 22. The pixel electrodes 16 are electrically connected to storage capacitor electrodes 25 through contact holes 26 which are openings in the OC layer 36, the resin CF layers 44R, 44G, 44B and the protective film 34 located above the storage capacitor electrodes 25.

Figure 10A:
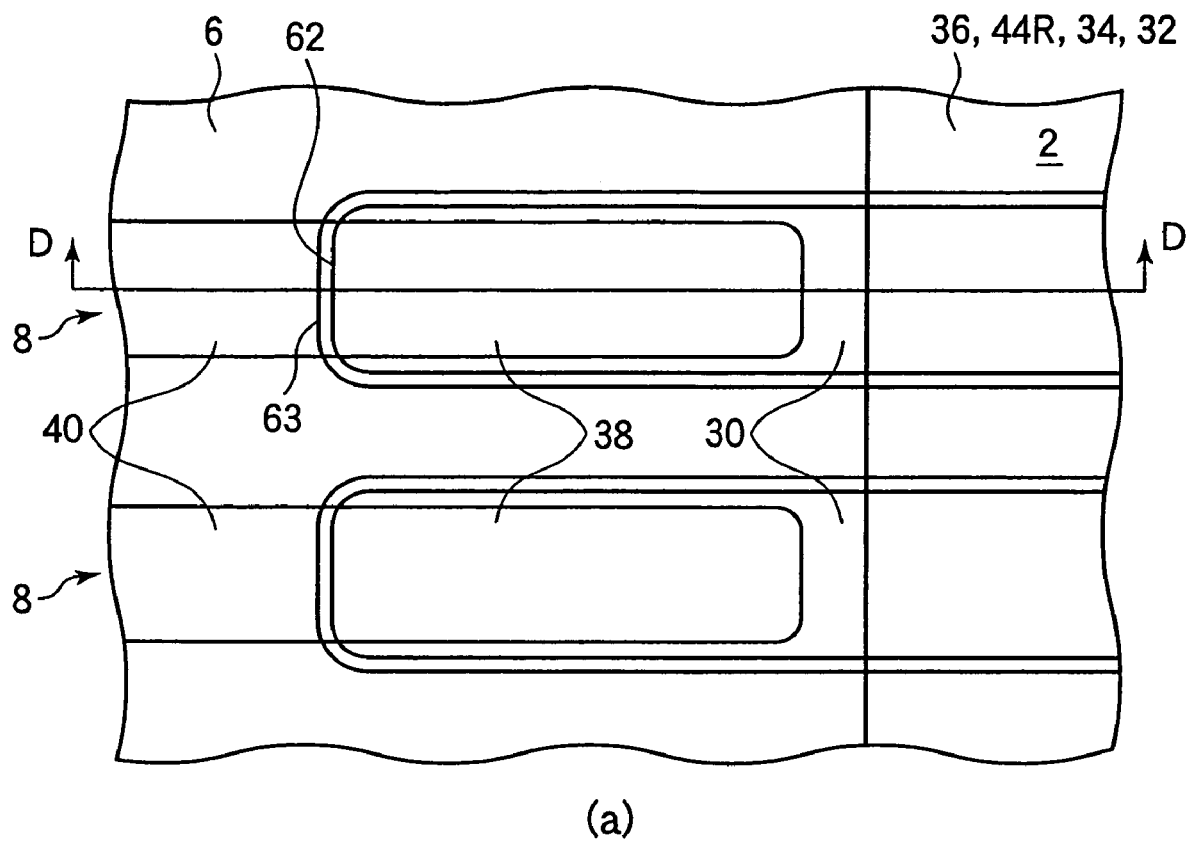
FIGS. 10A and 10B show a configuration of the neighborhood of electrode relaying regions of gate terminals of a substrate for a display according to the second embodiment of the invention.
Figure 10B:
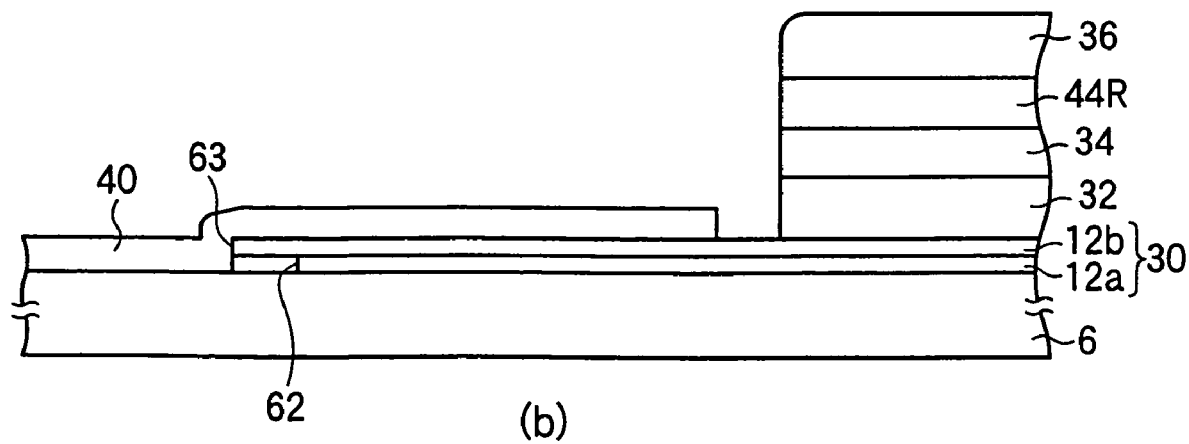

FIG. 10A shows a configuration of the neighborhood of electrode relaying regions of gate terminals of the substrate for a display of the present embodiment taken in a direction perpendicular to the substrate surface, and FIG. 10B shows a section taken along the line D-D in FIG. 10A. As shown in FIGS. 10A and 10B, a gate terminal 8 has a gate terminal bottom electrode 30 (first terminal electrode), a gate terminal top electrode 40 (second terminal electrode) and an electrode relaying region 38 in which the electrodes 30 and 40 are connected.

The gate terminal bottom electrode 30 is formed of the same material as that of the gate bus lines 12. Specifically, the gate terminal bottom electrode 30 has a structure in which an Al type metal layer 12a (first layer) and a high melting point metal layer (second layer) 12b are stacked in the order listed. An end face 62 of the Al type metal layer 12a of the gate terminal bottom electrode 30 is formed inwardly from an end face 63 of the high melting point metal layer 12b.

An insulation film 32 which is the same as the insulation film 32 shown in FIG. 9 is formed on the gate terminal bottom electrode 30. A protective film 34, a resin CF layer 44R (or 44G or 44B) and an OC layer 36 which are the same as the protective film 34, the resin CF layer 44R (or 44G or 44B) and the OC layer 36 shown in FIG. 9, respectively, are formed on the insulation film 32 in the order listed. The OC layer 36, the protective film 34, the resin CF layer 44R and the insulation film 32 have been removed in the vicinity of an electrode relaying region 38 during patterning to form a contact hole 24 above a source electrode 22 of a TFT 20. The OC layer 36, the protective film 34, the resin CF layer 44R and the insulation film 32 have end faces in a region on a display area side of the electrode relaying region 38.

A gate terminal top electrode 40 is formed on the gate terminal bottom electrode 30 in the relaying region 38. The gate terminal top electrode 40 is formed of the same material (such as an ITO) as that of a pixel electrode 16. The Al type metal layer 12a of the gate terminal bottom electrode 30 is not in contact with the gate terminal top electrode 40 because its end face 62 is formed inwardly from the end face 63 of the high melting point metal layer 12b.

In the present embodiment, the gate terminal top electrodes 40 made of an ITO are not in direct contact with the Al type metal layers 12a of the gate terminal bottom electrodes 30. This makes it possible to prevent corrosion of the terminal sections and to prevent line breakage attributable to corrosion.

In the present embodiment, the gate terminal top electrodes 40 are formed on a glass substrate 6 with a high degree of adhesion instead of being formed on the OC layer 36. This makes it possible to prevent the gate terminal top electrodes 40, the OC layer 36 and the resin CF layers 44R, 44G and 44B from being flaked when TAB terminals are peeled without using any special resin for the OC layer 36 and the resin CF layers 44R, 44G and 44B.

Figure 11A:
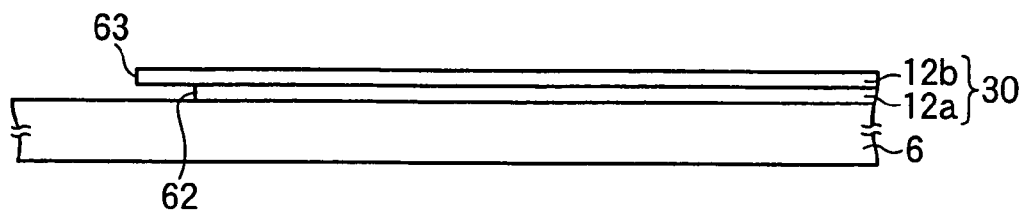
FIGS. 11A to 11E are sectional views taken in processes showing a method of manufacturing a substrate for a display according to the second embodiment of the invention.

A method of manufacturing a substrate for a display according to the present embodiment will now be described with reference to FIGS. 11A to 12D. FIGS. 11A to 12D are sectional views taken in processes showing steps for manufacturing a TFT substrate, and they show a section corresponding to that shown in FIG. 10B. First, as shown in FIG. 11A, an Al layer or Al alloy layer having a thickness of, for example, 130 nm and a Ti layer or Ti alloy layer having a thickness of, for example, 70 nm are formed in the order listed on an entire surface of a glass substrate 6 which is a transparent insulated substrate using sputtering, those layers being formed directly on the substrate or after forming a protective film of SiO$_x$ and the like on the substrate as occasion demands. Thus, a metal layer having a thickness of about 200 nm constituted by an Al type metal layer 12a and a high melting point metal layer 12b is formed. As the high melting point metal, for example, Cr, Mo, Ta, W and alloys of those metals maybe used instead of Ti. A material obtained by adding one or plurality of elements among Nd, Si, Cu, Ti, W, Ta and Sc to Al may be used as the Al alloy.

Next, a resist is applied throughout the top surface of the metal layers. The resist is then exposed and developed using a mask to form a resist pattern having a predetermined shape. Next, dry etching is performed using a chlorine type gas. As a result, gate terminal bottom electrodes 30 are formed, and gate bus lines 12 and storage capacitor bus lines 18 (both of which are not shown in FIG. 11A) are formed. Further, wet etching is performed using a phosphoric acid type etchant to etch sides of the Al type metal layers 12a. Thus, end faces 62 of the Al type metal layers 12a are formed inwardly from end faces 63 of the high melting point metal layers 12b. Depending on the conditions for the dry etching, the sides of the Al type metal layers 12a can be etched without performing wet etching.

Figure 11B:
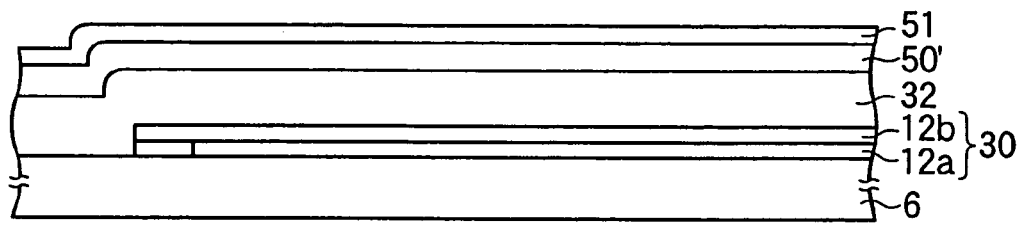

Next, as shown in FIG. 11B, a SiN film having a thickness of, for example, 400 nm is formed throughout the substrate using a plasma CVD process to provide an insulation film 32. Then, an a-Si layer 50' having a thickness of, for example, 150 nm for forming active semiconductor layers 50 is formed throughout the substrate using a plasma CVD process. Further, an n$^+$ a-Si layer 51 having a thickness of, for example, 30 nm for forming an ohmic contact layer is formed throughout the substrate using a plasma CVD process.

Spin coating or the like is then performed to apply a resist to the entire top surface of the n$^+$ a-Si layer 51. Then, exposure is performed in a forward direction (from above in FIG. 11B) using a mask. Development is thereafter performed to dissolve and remove the resist in exposed regions. Thus, resist patterns (not shown) are formed on regions where active semiconductor layers 50 of TFTs 20 are to be formed.

Figure 11C:
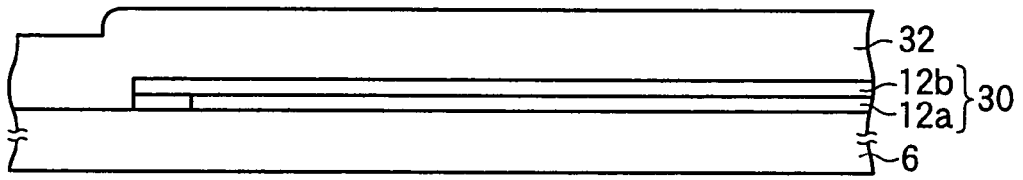

Next, dry etching is performed using a fluorine type gas and using the resist patterns obtained as described above as an etching mask. Thus, as shown in FIG. 11C, the n$^+$ a-Si layer 51 and the SiN film 23' are etched and removed in the vicinity of regions to become relaying regions 38 throughout the surface, and n$^+$ a-Si layers 51 and active semiconductor layers 50 are formed like islands in regions to become channel regions of TFTs 20 and in regions where drain electrodes 21 and source electrodes 22 are to be formed.

Figure 11D:
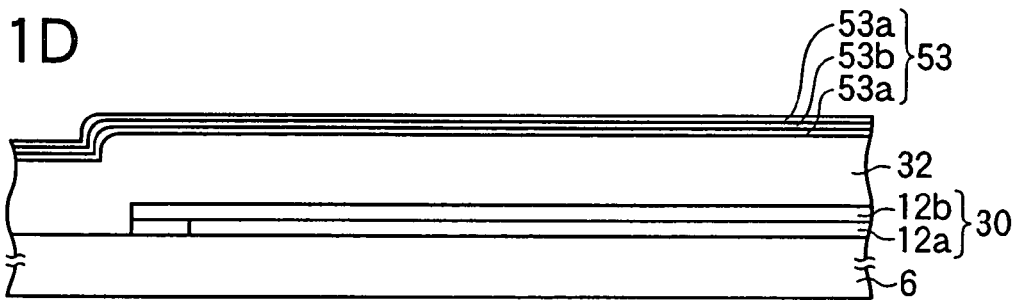

Next, as shown in FIG. 11D, the surface of the n$^+$ a-Si layer 51 is cleaned using dilute hydrofluoric acid, and a metal layer 53 is thereafter quickly formed to provide drain electrodes 21, source electrodes 22, storage capacitor electrodes 25 and drain bus lines 14, the metal layer 53 being a stack of, for example, a Ti layer (or Ti alloy layer) 53a, an Al layer (or Al alloy layer) 53b and another Ti layer (or Ti alloy layer) 53a which are formed using a sputtering process to thicknesses of 20, 75 and 40 nm, respectively. For example, high melting point metal layers made of Cr, Mo, Ta, W or an alloy of any of those elements may be used instead of the Ti layers 53a.

Figure 11E:
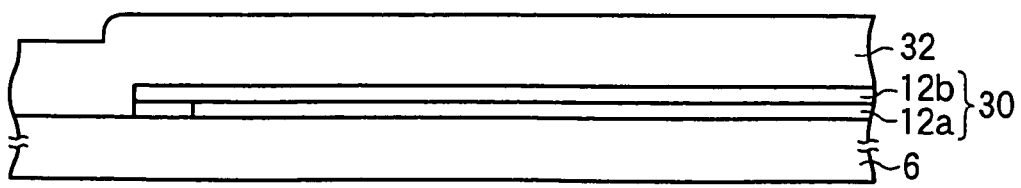

A resist is then applied to the entire top surface of the metal layer 53. Next, exposure and development is performed using a mask to form a resist pattern having a predetermined shape. Dry etching is performed on the metal layer 53 using a chlorine type gas and using the resist pattern as an etching mask. As a result, as shown in FIG. 11E, the metal layer 53 in the vicinity of the regions to become relaying regions 38 are etched and removed throughout the substrate to form the drain bus lines 14, the drain electrodes 21, the source electrodes 22 and the storage capacitor electrodes 25 (none of which is shown in FIG. 11E). Subsequently, dry etching is performed using a chlorine type gas to remove n$^+$ a-Si layers 51 that are left between the drain electrodes 21 and the source electrodes 22. This etching continues until the surface of the active semiconductor layers 50 is reached to ensure that the drain electrodes 21 and n$^+$ a-Si layers 51 under the same are separated from the source electrodes 22 and n$^+$ a-Si layers 51 under the same (channel etching).

Figure 12A:
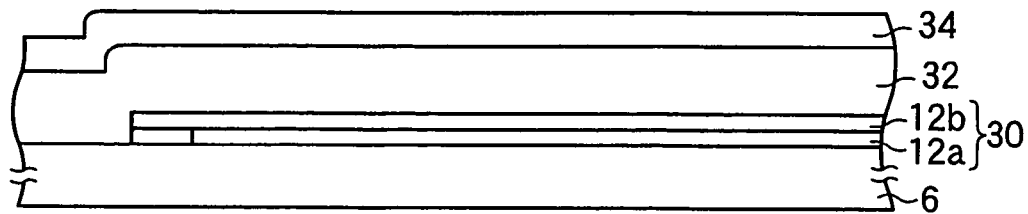
FIGS. 12A to 12D are sectional view taken in processes showing the method of manufacturing a substrate for a display according to the second embodiment of the invention.

Next, as shown in FIG. 12A, a SiN film having a thickness of, for example, 300 nm is formed throughout the substrate using a plasma CVD process to provide a protective film 34.

Figure 12B:
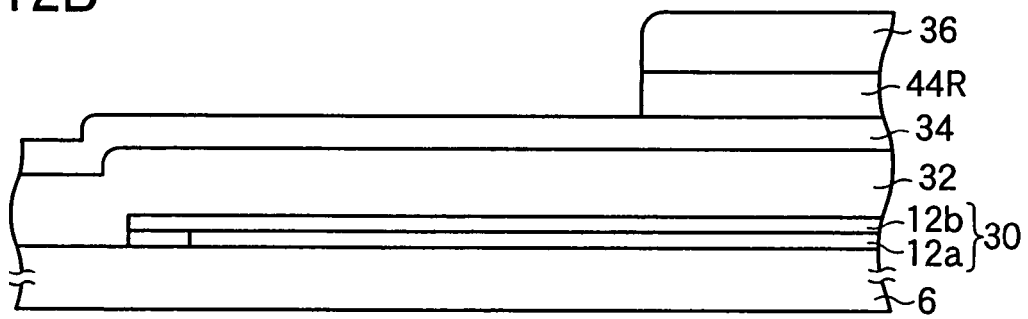

Next, any of resin CF layers 44R, 44G and 44B is formed at each pixel region. The resin CF layers 44R, 44G and 44B are formed like stripes such that the pixels adjacent to each other in the vertical direction in FIG. 8 are in the same color, for example. First, as shown in FIG. 12B, an acrylic negative photosensitive resin having, for example, a red pigment dispersed therein is applied to the entire surface of the protective film 34 to a thickness of, for example, 170 nm using a spin coater or slit coater. Proximity exposure is then performed using a large mask to leave the negative photosensitive resin in the form of stripes in a plurality of columns of pixel regions that are adjacent to each other in the vertical direction in FIG. 8. Next, development is performed using an alkaline developer such as KOH to form red resin CF layers 44R. Thus, spectral characteristics of red are imparted to red pixel regions, and a shielding function for preventing external light from entering the TFTs 20 in the red pixel regions is added.

Similarly, an acrylic negative photosensitive resin having a blue pigment dispersed therein is applied and patterned to form blue resin CF layers 44B in the form of stripes in pixel regions adjacent to the red resin CF layers 44R. Thus, spectral characteristics of blue are imparted to blue pixel regions, and a shielding function for preventing external light from entering the TFTs 20 in the blue pixel regions is added.

Further, an acrylic negative photosensitive resin having a green pigment dispersed therein is applied and patterned to form green resin CF layers 44G in the form of stripes in pixel regions adjacent to the red resin CF layers. 44R and the blue resin CF layers 44B. Thus, spectral characteristics of green are imparted to green pixel regions, and a shielding function for preventing external light from entering the TFTs 20 in the green pixel regions is added.

Contact holes 24 are then provided in the resin CF layers 44R, 44G and 44B above the source electrodes 22 of the TFTs 20. Similarly, contact holes 26 are provided in the resin CF layers 44R, 44G and 44B above the storage capacitor electrodes 25.

Next, an OC resin is applied to the entire surface of the resin CF layers 44R, 44G and 44B using a spin coater or slit coater, and a heating process is performed at a temperature of 140° C. or lower to form an OC layer 36. For example, an acrylic resin having negative photosensitivity is used as the OC resin. Proximity exposure is then performed using a large mask, and development is performed using an alkaline developer such as KOH to pattern the OC layer 36. The OC layer 36 is removed to expose the surface of the protective film 34 in the vicinity of the electrode relaying regions 38 and in a region on a substrate-end side of the electrode relaying regions 38. Contact holes 24 and 26 are formed in the OC layer 36 in alignment with the contact holes 24 and 26 in the resin CF layers 44R, 44G and 44B.

Figure 12C:
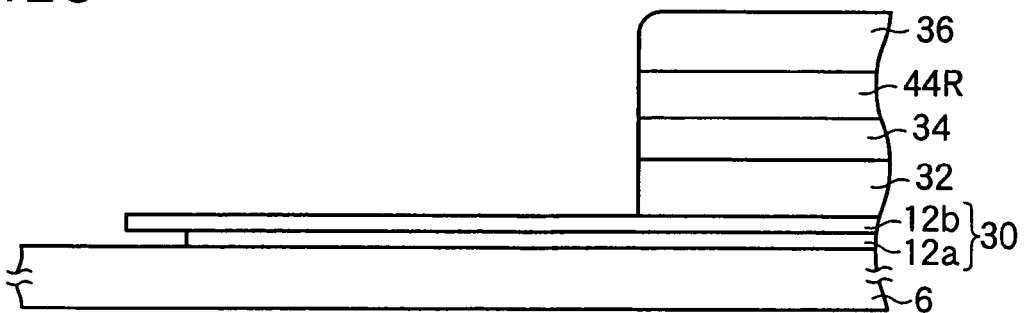

Subsequently, as shown in FIG. 12C, dry etching is performed with a fluorine type gas to etch and remove the protective film 34 and the insulation film 32 using the patterned OC layer 36 as an etching mask. As a result of this etching, the protective film 34 and the insulation film 32 are removed in regions where gate terminal top electrodes 40 are to be formed, and surfaces of the high melting point metal layers 12b of the gate terminal bottom electrodes 30 and a surface of the glass substrate 6 are exposed. At the same time, openings are formed in the protective film 34 and the insulation film 32 above the source electrodes 22 of the TFTs 20 to form the contact holes 24. At the same time, openings are formed in the protective film 34 and the insulation film 32 above the storage capacitor electrodes 25 to form the contact holes 26.

While side etching of the Al type metal layers 12a is performed immediately after forming the gate terminal bottom electrodes 30 in the present embodiment (see FIG. 11A), the side etching of the Al type metal layers 12a may be performed after the OC layer 36, the protective film 34 and the insulation film 32 are patterned to expose the gate terminal bottom electrodes 30 just as in the first embodiment.

Figure 12D:
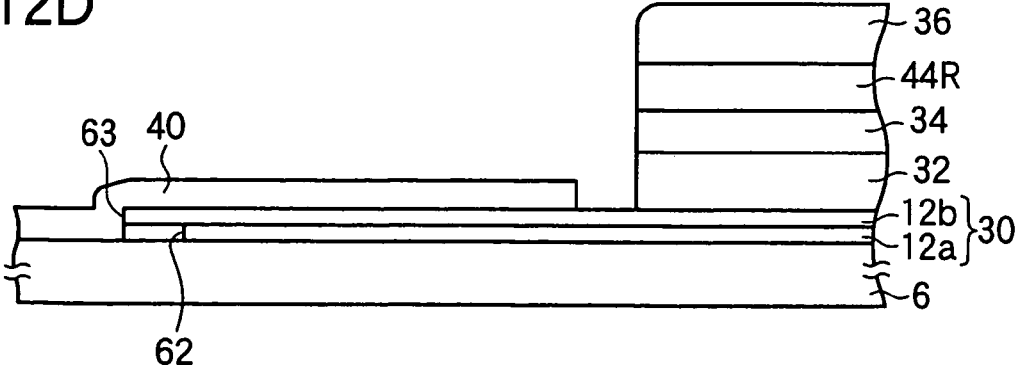

Subsequently, as shown in FIG. 12D, an ITO layer having a thickness of, for example, 70 nm that is a transparent oxide conductive material is formed throughout the substrate using a thin film forming method such as sputtering. Next, a resist pattern having a predetermined shape is formed, and wet etching is performed using an oxalic acid type etchant and using the resist pattern as an etching mask. Thus, gate terminal top electrodes 40 which are electrically connected to the gate terminal bottom electrodes 30 are formed in the electrode relaying regions 38. At the same time, a pixel electrode 16 is formed at each pixel region, the pixel electrode being electrically connected to the source electrode 22 through the contact hole 24 and being electrically connected to the storage capacitor electrode 25 through the contact hole 26. The Al type metal layers 12a of the gate terminal bottom electrodes 30 are not in contact with the gate terminal top electrodes 40 made of an ITO because their end faces 62 are formed inwardly from end faces 63 of the high melting point metal layers 12b. Thus, corrosion of the terminal sections and line breakage attributable to corrosion can be prevented to improve the reliability of the terminal sections. Thereafter, a thermal process is performed at a temperature in the range from 150 to 230° C. or preferably at a temperature of 200° C.

As described above, the present embodiment makes it possible to provide a highly reliable liquid crystal display without making manufacturing steps complicated.

Third Embodiment

Figure 13A:
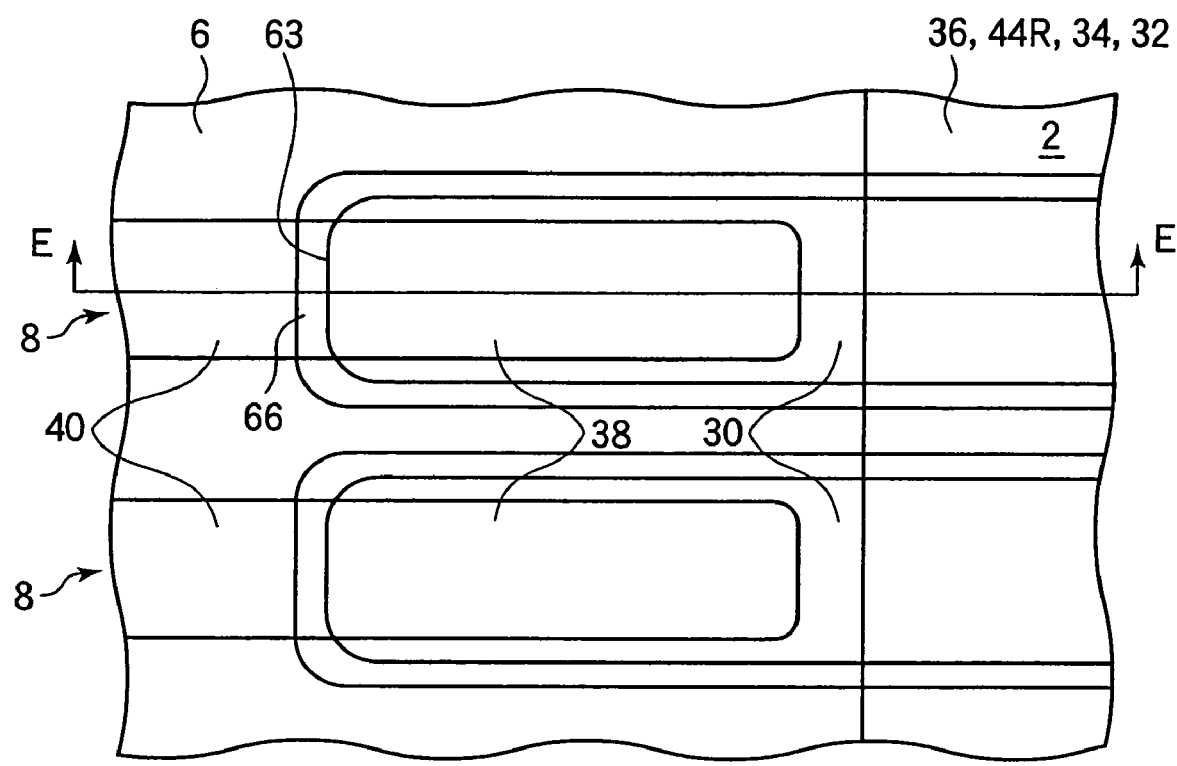
FIGS. 13A and 13B show a configuration of the neighborhood of electrode relaying regions of gate terminals of a substrate for a display according to a third embodiment of the invention.
Figure 13B:
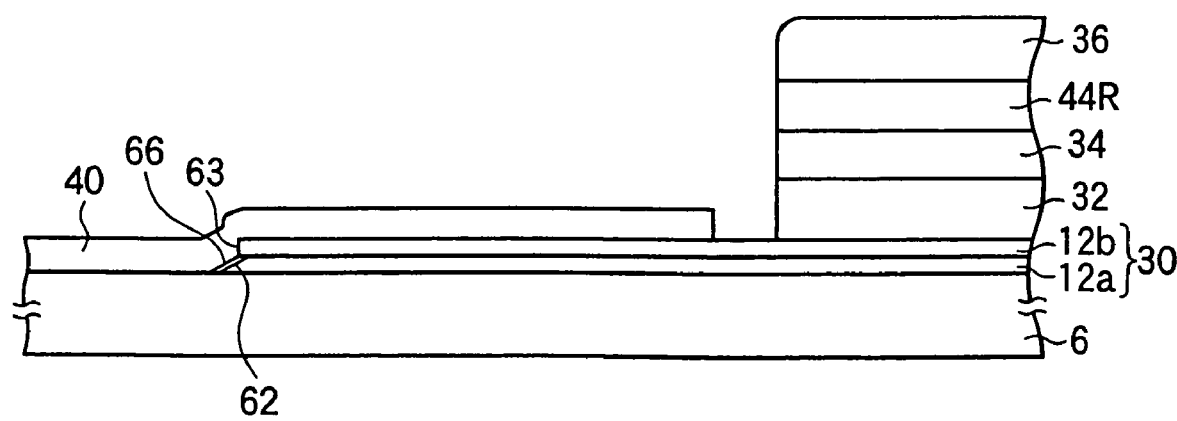

A description will now be made with reference to FIGS. 13A to 15D on a substrate for a display and a method of manufacturing the same according to a third embodiment of the invention. FIG. 13A shows a configuration of the neighborhood of electrode relaying regions of gate terminals of a base substrate for a display according to the present embodiment taken in a direction perpendicular to the substrate surface, and FIG. 13B shows a section taken along the line E-E in FIG. 13A. As shown in FIGS. 13A and 13B, agate terminal 8 has a gate terminal bottom electrode 30 (first terminal electrode), a gate terminal top electrode 40 (second terminal electrode) and an electrode relaying region 38 in which the electrodes 30 and 40 are connected.

The gate terminal bottom electrode 30 is formed of the same material as that of gate bus lines 12. Specifically, the gate terminal bottom electrode 30 has a structure in which an Al type metal layer (first layer) 12a and a high melting point metal layer (second layer) 12b are stacked in the order listed. The Al type metal layer 12a of the gate terminal bottom electrode 30 has a forwardly tapered configuration in which the width of the layer is greater, the closer the layer to a glass substrate 6. An end face 62 of the Al type metal layer 12a is formed such that the upper side thereof is substantially in alignment with an end face 63 of the high melting point metal layer 12b, and the side of the glass substrate 6 is located outwardly from the end face 63 of the high melting point metal layer 12b. An end face insulation film 66 such as an Al oxide film or Al nitride film is formed on the end face 62 of the Al type metal layer 12a. For example, the end face insulation film 66 has a thickness of 30 nm or less.

An insulation film 32 is formed on the gate terminal bottom electrode 30. A protective film 34, a resin CF layer 44R(or 44G or 44B)and an OC layer 36 are formed on the insulation film 32 in the order listed. The OC layer 36, the protective film 34, the resin CF layer 44R and the insulation film 32 have been removed in the vicinity of an electrode relaying region 38 during patterning to form a contact hole 24 above a source electrode 22 of a TFT 20. The OC layer 36, the protective film 34, the resin CF layer 44R and the insulation film 32 have end faces which are located in a region on a display area side of the electrode relaying region 38.

A gate terminal top electrode 40 is formed on the gate terminal bottom electrode 30 in the relaying region 38. The gate terminal top electrode 40 is formed of the same material (such as an ITO) as that of a pixel electrode 16. Since the end face insulation film 66 is formed on the end face of the Al type metal layer 12a of the gate terminal bottom electrode 30, the metal layer is not in contact with the gate terminal top electrode 40.

In the present embodiment, the gate terminal top electrodes 40 made of an ITO or the like are not in direct contact with the Al type metal layers 12a of the gate terminal bottom electrodes 30. This makes it possible to prevent corrosion of the terminal sections and to prevent line breakage attributable to corrosion.

In the present embodiment, the gate terminal top electrodes 40 are formed on the glass substrate 6 with a high degree of adhesion instead of being formed on the OC layer 36. This makes it possible to prevent the gate terminal top electrodes 40, the OC layer 36 and the resin CF layers 44R, 44G and 44B from being flaked when TAB terminals are peeled without using any special resin for the OC layer 36 and the resin CF layers 44R, 44G and 44B.

Figure 14A:
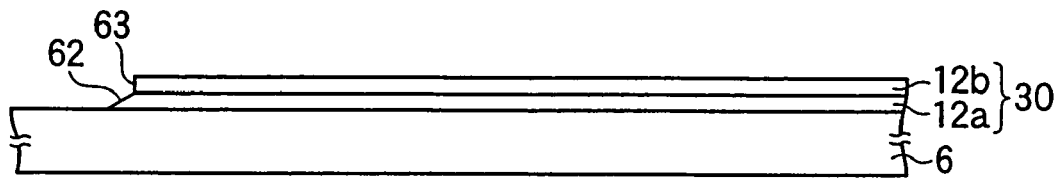
FIGS. 14A to 14E are sectional views taken in processes showing a method of manufacturing a substrate for a display according to the third embodiment of the invention.

A method of manufacturing a substrate for a display according to the present embodiment will now be described with reference to FIGS. 14A to 15D. FIGS. 14A to 15D are sectional views taken in processes showing steps for manufacturing a TFT substrate having channel-etched TFTs, and they show a section corresponding to that shown in FIG. 13B. First, as shown in FIG. 14A, an Al layer or Al alloy layer having a thickness of, for example, 130 nm, a Mo layer or Mo alloy layer having a thickness of, for example, 70 nm, and another Mo layer or Mo alloy layer having a thickness of, for example, 10 nm are formed in the order listed on an entire surface of a glass substrate 6 which is a transparent insulated substrate using sputtering, those layers being formed directly on the substrate or after forming a protective film of $SiO_x$ and the like on the substrate as occasion demands. Thus, a metal layer having a thickness of about 210 nm constituted by an Al type metal layer 12a and high melting point metal layers 12b is formed. As the high melting point metal, for example, Cr, Ti, Ta, W and alloys of those metals may be used instead of Mo. A material obtained by adding one or plurality of elements among Nd, Si, Cu, Ti, W, Ta and Sc to Al may be used as the Al alloy.

Next, a resist is applied throughout the top surface of the metal layers. The resist is then exposed and developed using a mask to form a resist pattern having a predetermined shape. Next, wet etching is performed using a phosphoric acid type etchant. As a result, gate terminal bottom electrodes 30 are formed, and gate bus lines 12 and storage capacitor bus lines 18 (both of which are not shown in FIG. 14A) are formed. At this time, the end faces 62 of the Al type metal layers 12a are formed in a forwardly tapered configuration.

Figure 14B:
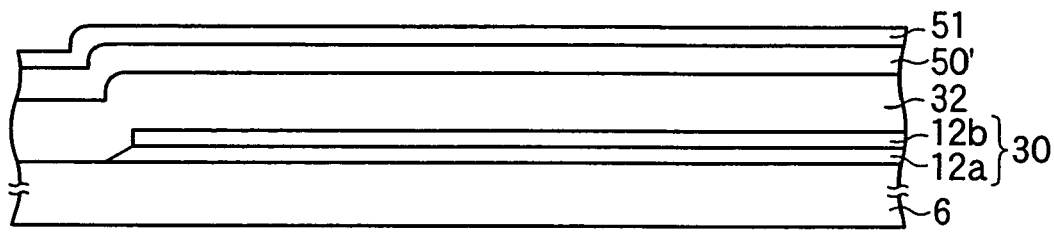

Next, as shown in FIG. 14B, a SiN film having a thickness of, for example, 400 nm is formed throughout the substrate using a plasma CVD process to provide an insulation film 32. Then, an a-Si layer 50' having a thickness of, for example, 150 nm for forming active semiconductor layers 50 is formed throughout the substrate using a plasma CVD process. Further, an $n^+$ a-Si layer 51 having a thickness of, for example, 30 nm for forming an ohmic contact layer is formed throughout the substrate using a plasma CVD process.

Spin coating is then performed to apply a resist to the entire top surface of the $n^+$ a-Si layer 51. Then, exposure is performed in a forward direction (from above in FIG. 14B) using a mask. Development is thereafter performed to dissolve and remove the resist in exposed regions. Thus, resist patterns (not shown) are formed on regions where active semiconductor layers 50 of TFTs 20 are to be formed.

Figure 14C:
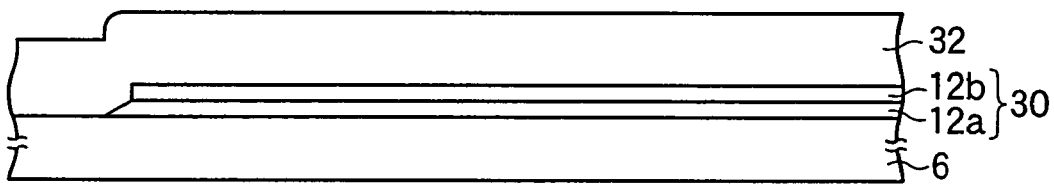

Next, dry etching is performed using a fluorine type gas and using the resist patterns obtained as described above as an etching mask. Thus, as shown in FIG. 14C, the $n^+$ a-Si layer 51 and the SiN film 23' are etched and removed in the vicinity of regions to become relaying regions 38 throughout the surface, and $n^+$ a-Si layers 51 and active semiconductor layers 50 are formed like islands in regions to become channel regions of TFTs 20 and in regions where drain electrodes 21 and source electrodes 22 are to be formed.

Figure 14D:
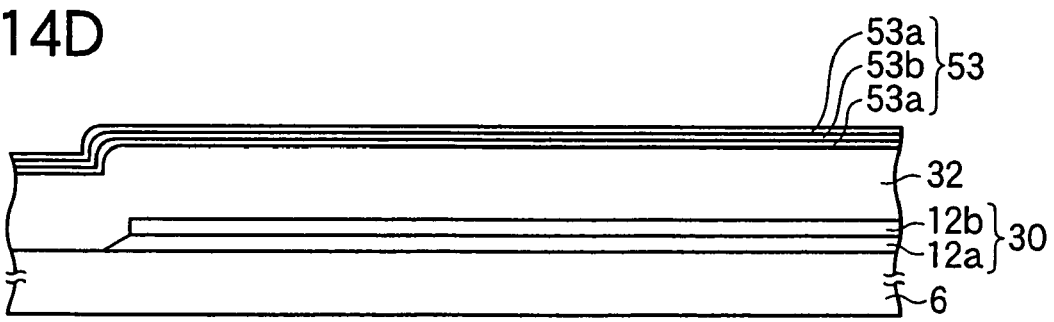

Next, as shown in FIG. 14D, the surface of the $n^+$ a-Si layer 51 is cleaned using dilute hydrofluoric acid, and a metal layer 53 is thereafter quickly formed to provide drain electrodes 21, source electrodes 22, storage capacitor electrodes 25 and drain bus lines 14, the metal layer 53 being a stack of, for example, a Ti layer (or Ti alloy layer) 53a, an Al layer (or Al alloy layer) 53b and another Ti layer (or Ti alloy layer) 53a which are formed using a sputtering process to thicknesses of 20, 75 and 40 nm, respectively. For example, high melting point metal layers made of Cr, Mo, Ta, W, or an alloy of any of those elements may be used instead of the Ti layers 53a.

Figure 14E:
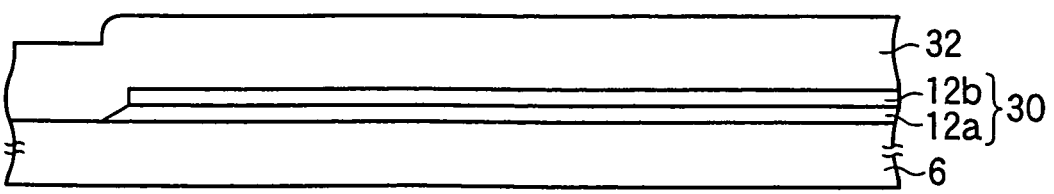

A resist is then applied to the entire top surface of the metal layer 53. Next, exposure and development is performed using a mask to form a resist pattern having a predetermined shape. Dry etching is performed on the metal layer 53 using a chlorine type gas and using the resist pattern as an etching mask. As a result, as shown in FIG. 14E, the metal layer 53 in the vicinity of the regions to become relaying regions 38 are etched and removed throughout the substrate to form the drain bus lines 14, the drain electrodes 21, the source electrodes 22 and the storage capacitor electrodes 25 (none of which is shown in FIG. 14E).

Subsequently, dry etching is performed using a chlorine type gas to remove $n^+$ a-Si layers 51 that are left between the drain electrodes 21 and the source electrodes 22. This etching continues until the surface of the active semiconductor layers 50 is reached to ensure that the drain electrodes 21 and $n^+$ a-Si layers 51 under the same are separated from the source electrodes 22 and $n^+$ a-Si layers 51 under the same (channel etching).

Figure 15A:
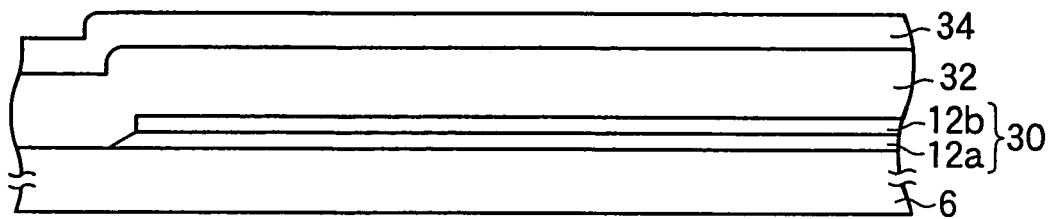
FIGS. 15A to 15D are sectional view taken in processes showing the method of manufacturing a substrate for a display according to the third embodiment of the invention.

Next, as shown in FIG. 15A, a SiN film having a thickness of, for example, 300 nm is formed throughout the substrate using a plasma CVD process to provide a protective film 34.

Figure 15B:
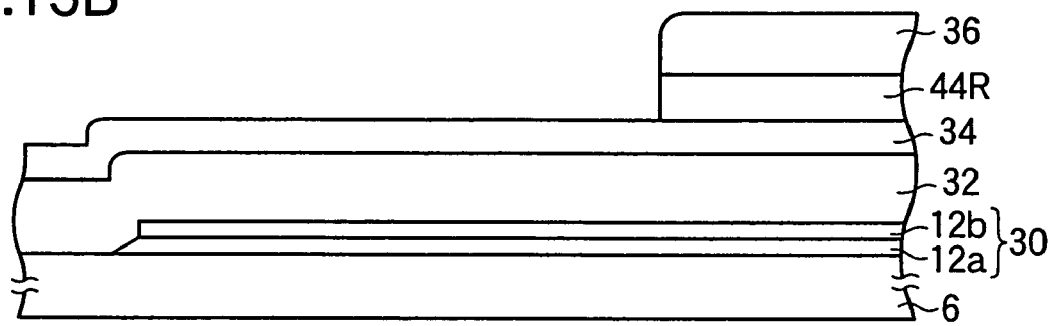

Next, any of resin CF layers 44R, 44G and 44B is formed at each pixel region. The resin CF layers 44R, 44G and 44B are formed like stripes such that pixels adjacent to each other in the vertical direction of a display screen are in the same color, for example. First, as shown in FIG. 15B, an acrylic negative photosensitive resin having, for example, a red pigment dispersed therein is applied on the entire surface of the protective film 34 to a thickness of, for example, 170 nm using a spin coater or slit coater. Proximity exposure is then performed using a large mask to leave the negative photosensitive resin in the form of stripes in a plurality of columns of pixel regions that are adjacent to each other in the vertical direction of the display screen. Next, development is performed using an alkaline developer such as KOH to form red resin CF layers 44R. Thus, spectral characteristics of red are imparted to red pixel regions, and a shielding function for preventing external light from entering the TFTs 20 in the red pixel regions can be added.

Similarly, an acrylic negative photosensitive resin having a blue pigment dispersed therein is applied and patterned to form blue resin CF layers 44B in the form of stripes in pixel regions adjacent to the red resin CF layers 44R. Thus, spectral characteristics of blue are imparted to blue pixel regions, and a shielding function for preventing external light from entering the TFTs 20 in the blue pixel regions is added.

Further, an acrylic negative photosensitive resin having a green pigment dispersed therein is applied and patterned to form green resin CF layers 44G in the form of stripes in pixel regions adjacent to the red resin CF layers 44R and the blue resin CF layers 44B. Thus, spectral characteristics of green are imparted to green pixel regions, and a shielding function for preventing external light from entering the TFTs 20 in the green pixel regions is added.

Contact holes 24 are then provided in the resin CF layers 44G and 44B above the source electrodes 22 of the TFTs 20. Similarly, contact holes 26 are provided in the resin CF layers 44R, 44G and 44B above the storage capacitor electrodes 25.

Next, an OC resin is applied to the entire surface of the resin CF layers 44R, 44G and 44B using a spin coater or slit coater, and a heating process is performed at a temperature of 140° C. or lower to form an OC layer 36. For example, an acrylic resin having negative photosensitivity is used as the OC resin. Proximity exposure is then performed using a large mask, and development is performed using an alkaline developer such as KOH to pattern the OC layer 36. The OC layer 36 is removed to expose the surface of the protective film 34 in the vicinity of the electrode relaying regions 38 and in a region on a substrate-end side of the electrode relaying regions 38. Contact holes 24 and 26 are formed in the OC layer 36 in alignment with the contact holes 24 and 26 in the resin CF layers 44R, 44G and 44B.

Figure 15C:
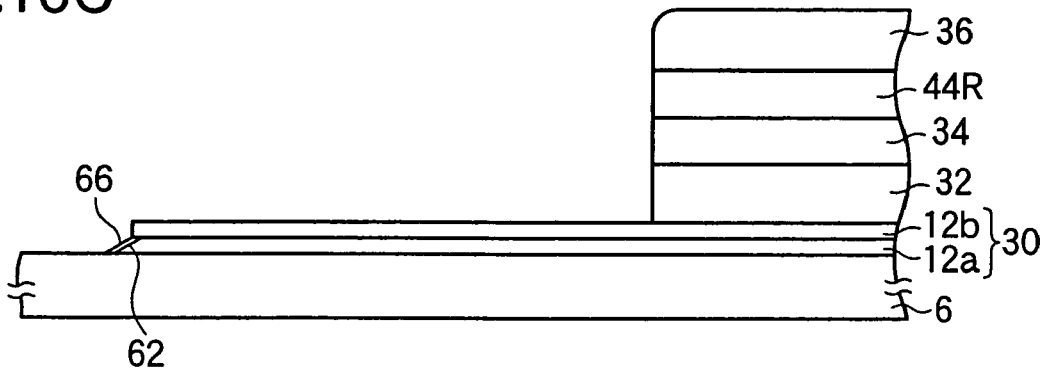

Subsequently, as shown in FIG. 15C, dry etching is performed with a fluorine type gas to etch and remove the protective film 34 and the insulation film 32 using the patterned OC layer 36 as an etching mask. As a result of this etching, the protective film 34 and the insulation film 32 are removed in regions where gate terminal top electrodes 40 are to be formed, and surfaces of the high melting point metal layers 12b of the gate terminal bottom electrodes 30 and a surface of the glass substrate 6 are exposed. At the same time, openings are formed in the protective film 34 and the insulation film 32 above the source electrodes 22 of the TFTs 20 to form the contact holes 24. At the same time, openings are formed in the protective film 34 and the insulation film 32 above the storage capacitor electrodes 25 to form the contact holes 26.

Subsequently, the end faces 62 of the Al type metal layers 12a of the gate terminal bottom electrodes 30 thus exposed are oxidized through, for example, an $O_2$ ashing process to form end face insulation films 66 constituted by oxides of the Al type metal layers. The end face insulation films 66 may be formed through high pressure oxidation or thermal processing. The end faces 62 of the Al type metal layers 12a may be nitrided using nitrogen plasma to form end face insulation films 66 constituted by nitrides of the Al type metal layers.

Figure 15D:
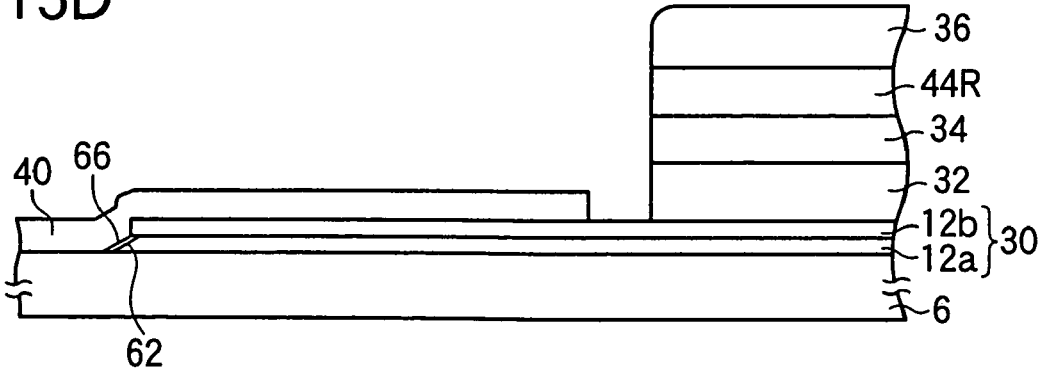
Figure 16A:
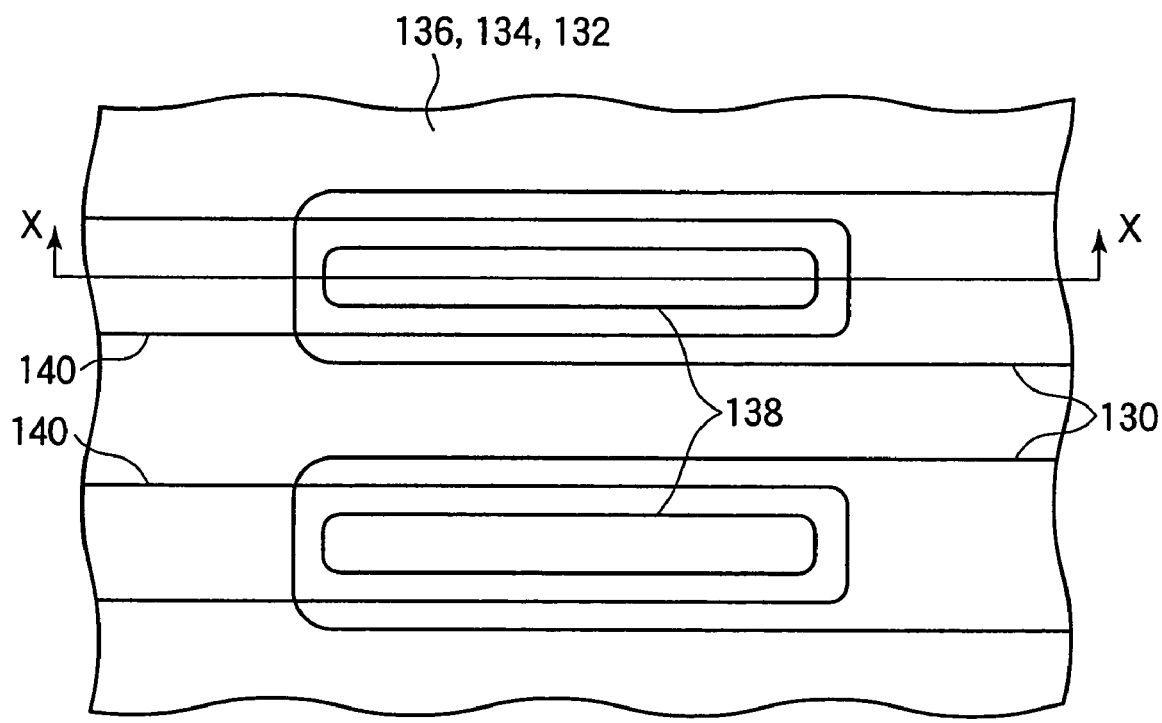
FIGS. 16A and 16B show a configuration of the neighborhood of electrode relaying regions of gate terminals of a substrate for a liquid crystal display according to the related art.
Figure 16B:
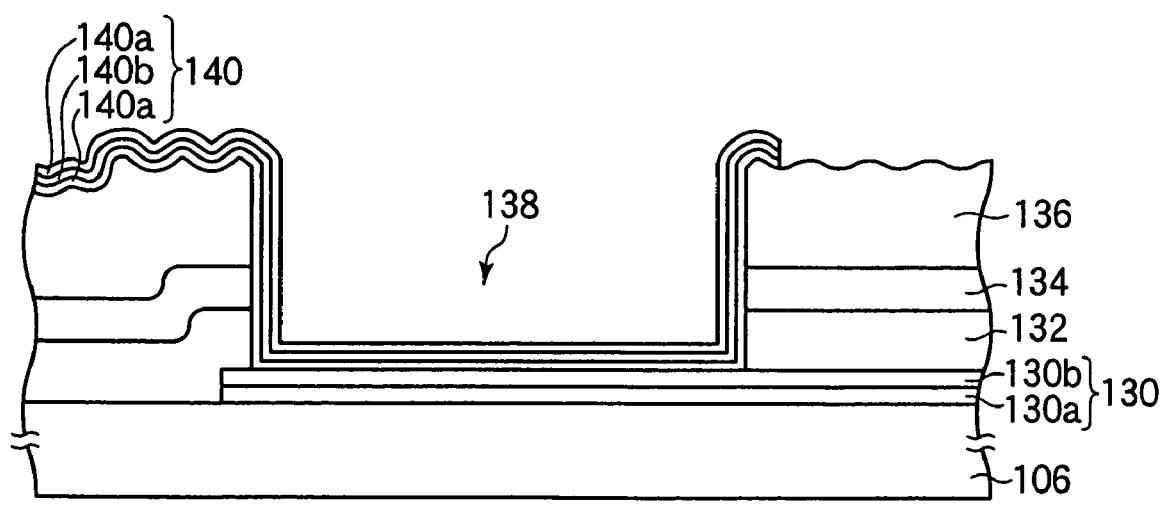
Figure 17A:
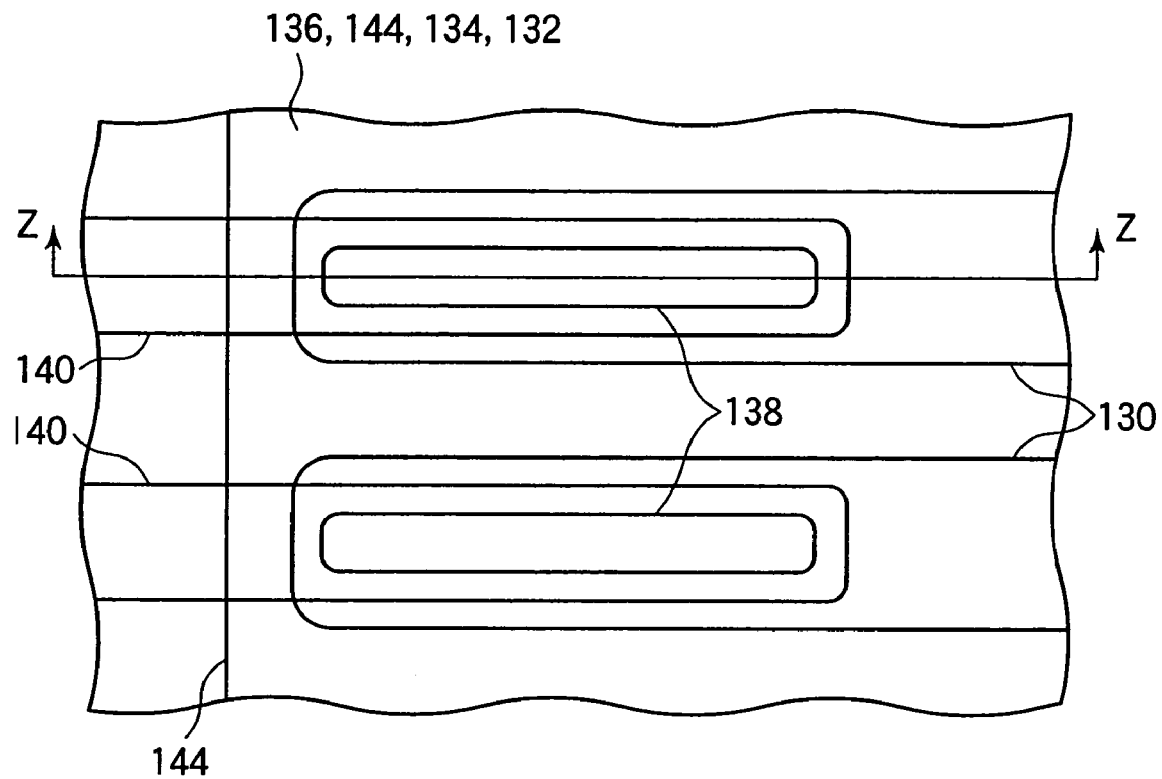
FIGS. 17A and 17B show a configuration of the neighborhood of electrode relaying regions of gate terminals of a substrate for a liquid crystal display according to the related art.
Figure 17B:
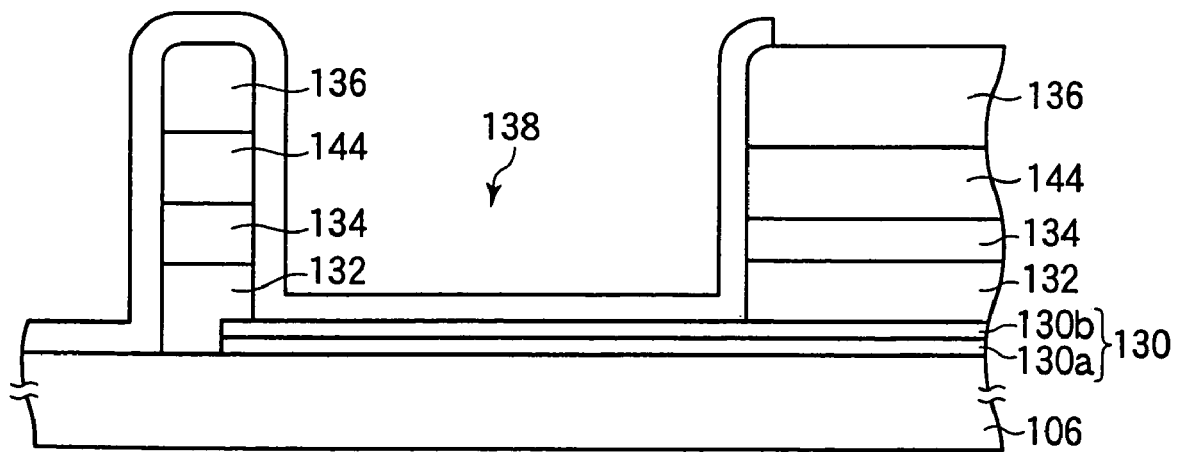
Figure 18A:
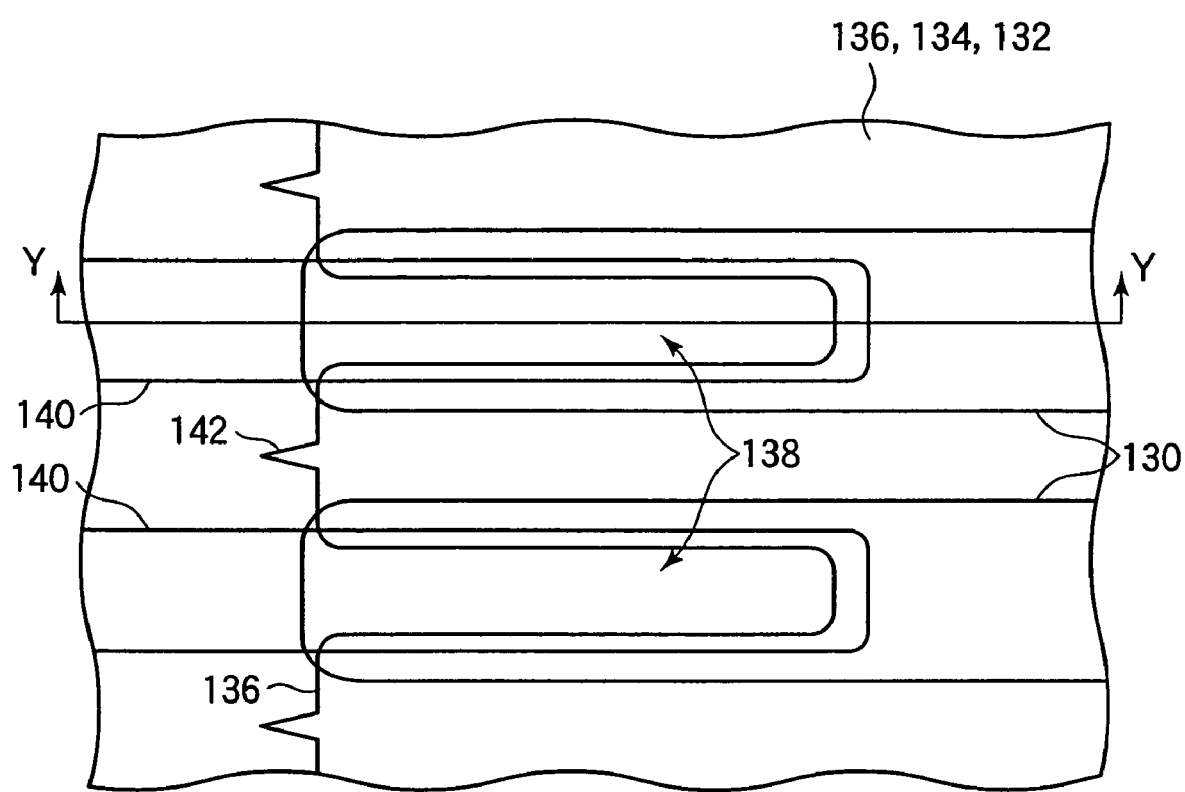
FIGS. 18A and 18B show a configuration of the neighborhood of electrode relaying regions of gate terminals of a substrate for a liquid crystal display according to the related art.
Figure 18B:
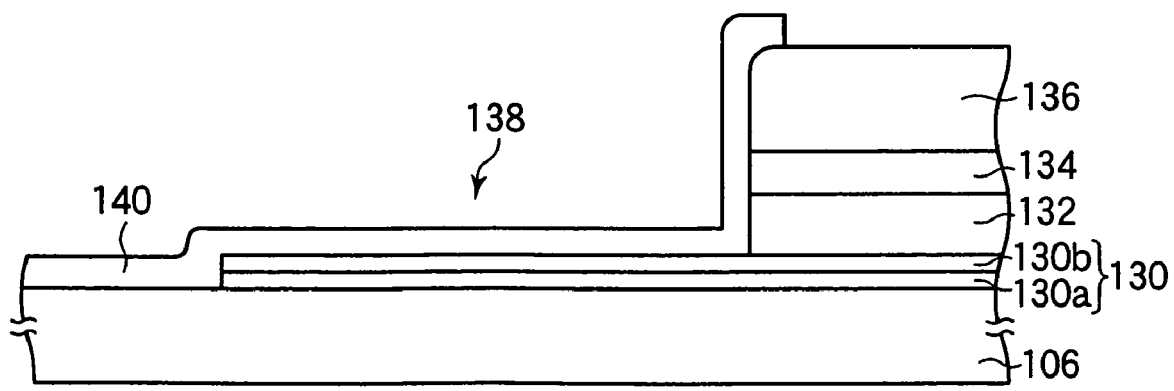
Figure 19A:
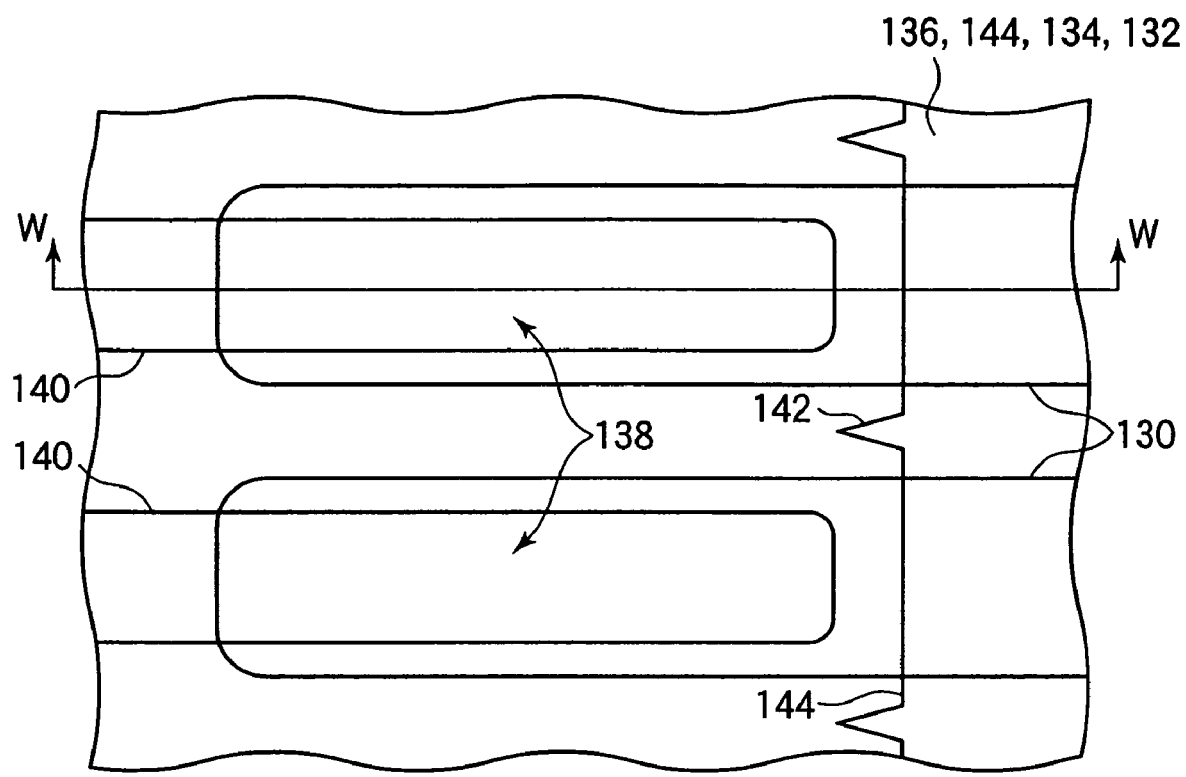
FIGS. 19A and 19B show a configuration of the neighborhood of electrode relaying regions of gate terminals of a substrate for a liquid crystal display according to the related art.
Figure 19B:
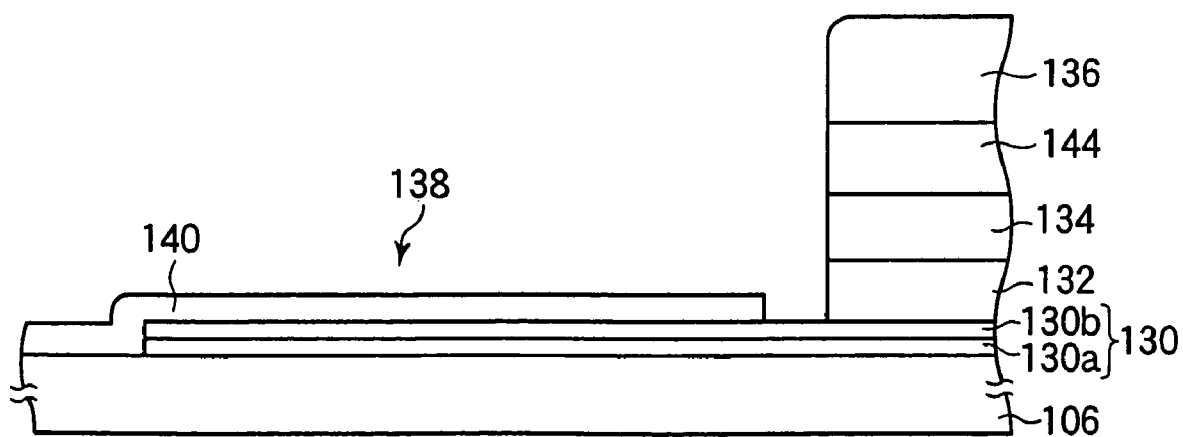

Next, as shown in FIG. 15D, an ITO layer having a thickness of, for example, 70 nm that is a transparent oxide conductive material is formed throughout the substrate using a thin film forming method such as sputtering. Next, a resist pattern having a predetermined shape is formed, and wet etching is performed using an oxalic acid type etchant and using the resist pattern as an etching mask. Thus, gate terminal top electrodes 40 which are electrically connected to the gate terminal bottom electrodes 30 are formed in the electrode relaying regions 38. At the same time, a pixel electrode 16 is formed on a display area at each pixel region, the pixel electrode being electrically connected to the source electrode 22 through the contact hole 24 and being electrically connected to the storage capacitor electrode 25 through the contact hole 26. The Al type metal layers 12a of the gate terminal bottom electrodes 30 are not in contact with the gate terminal top electrodes 40 made of an ITO because the end face insulation film 66 is formed on their end faces 62. Thus, corrosion of the terminal sections and line breakage attributable to corrosion can be prevented to improve the reliability of the terminal sections. Thereafter, a thermal process is performed at a temperature in the range from 150 to 230° C. or preferably at a temperature of 200° C.

As described above, the present embodiment makes it possible to provide a highly reliable liquid crystal display without making manufacturing steps complicated.

The invention is not limited to the above-described embodiments and may be modified in various ways.

For example, although transmissive and reflective liquid crystal displays have been referred to as examples in the above embodiments, the invention is not limited to them and may be also applied to transflective liquid crystal displays.

As described above, the invention makes it possible to provide a substrate for a display which can be manufactured at simple manufacturing steps with high reliability, a method of manufacturing the same, and a display having the same.

What is claimed is:

1. A substrate for a display, comprising:
a plurality of bus lines formed on a base substrate such that they intersect with each other with an insulation film interposed therebetween;
an insulation resin layer formed on the bus lines;
a pixel electrode formed on the insulation resin layer in each of pixel regions arranged on the base substrate; and
an external connection terminal for electrically connecting an external circuit and the bus lines, the external connection terminal including:
a first terminal electrode which has a first layer formed of Al or Al alloy, an end face insulation film formed on an end face of the first layer, and a second layer formed of a high melting point metal on the first layer and which is electrically connected to the bus lines; and
a second terminal electrode which is formed of the same material as that of the pixel electrode on the first terminal electrode and which is electrically connected to the first terminal electrode without contacting the first layer.

2. A substrate for a display according to claim 1, wherein the end face insulation film is a nitride film or oxide film of the Al or Al alloy.

3. A substrate for a display according to claim 1, wherein the end face insulation film has a thickness of 30 nm or less.

* * * * *